United States Patent [19]

Jyomura et al.

[11] Patent Number: 4,565,642
[45] Date of Patent: Jan. 21, 1986

[54] PIEZOELECTRIC SUBSTANCES

[75] Inventors: Shigeru Jyomura, Tokyo; Hiroshi Takeuchi, Matsudo, both of Japan

[73] Assignees: Hitachi, Ltd.; Hitachi Medical Corp., both of Tokyo, Japan

[21] Appl. No.: 513,424

[22] Filed: Jul. 13, 1983

[30] Foreign Application Priority Data

Jul. 14, 1982 [JP] Japan ............................. 57-121156
Sep. 10, 1982 [JP] Japan ............................. 57-156746
Nov. 4, 1982 [JP] Japan ............................. 57-192481
Dec. 22, 1982 [JP] Japan ............................. 57-223810

[51] Int. Cl.$^4$ ............................................. C04B 35/49
[52] U.S. Cl. .................................................. 252/62.9
[58] Field of Search ...................................... 252/62.9

[56] References Cited

U.S. PATENT DOCUMENTS 3,268,453 8/1966 Ouchi et al. ................... 252/62.9
3,699,045 10/1972 Tsubouchi et al. ............. 252/62.9
4,255,272 3/1981 Ogawa .......................... 252/62.9

OTHER PUBLICATIONS

Clark et al., "Ferroelectrics", vol. 13, pp. 497-500, 1976.

Primary Examiner—Jack Cooper
Attorney, Agent, or Firm—Antonelli, Terry & Wands

[57] ABSTRACT

A piezoelectric substance, which comprises a ternary solid solution having a composition represented by the general formula:

$$xPbZrO_3 - yA - zPbTiO_3$$

and having a composition ratio represented by coordinate in a square formed by successively connecting point P ($x=0.905$; $y=0.095$; $z=0.000$), point Q ($x=0.960$; $y=0.040$; $z=0.000$), point R ($x=0.932$; $y=0.005$; $z=0.063$), point S ($x=0.905$; $y=0.005$; $z=0.090$) and said P by straight lines, including the respective lines except axis y in a ternary composition diagram showing the composition of said ternary solid solution, and said A being $Pb(Mn_{\frac{1}{3}}Nb_{\frac{2}{3}})O_3$, $Pb(Mn_{\frac{1}{2}}Nb_{\frac{1}{2}})O_3$, $Pb(Fe_{\frac{1}{2}}Sb_{\frac{1}{2}})O_3$, $Pb(Mn_{\frac{1}{2}}Ta_{\frac{1}{2}})O_3$, $Pb(Mn_{\frac{1}{3}}Sb_{\frac{2}{3}})O_3$, $Pb(Mn_{\frac{1}{2}}Sb_{\frac{1}{2}})O_3$, $Pb(Fe_{\frac{1}{2}}Nb_{\frac{1}{2}})O_3$, $Pb(Fe_{\frac{1}{3}}Sb_{\frac{2}{3}})O_3$, $Pb(Mn_{\frac{1}{2}}Ta_{\frac{2}{3}})O_3$, $Pb(Fe_{\frac{1}{2}}Nb_{\frac{2}{3}})O_3$, $Pb(Sb_{\frac{1}{2}}Ta_{\frac{1}{2}})O_3$, $Pb(Fe_{\frac{1}{2}}Ta_{\frac{2}{3}})O_3$, $Pb(Mn_{\frac{2}{3}}W_{\frac{1}{3}})O_3$, $Pb(Sb_{\frac{1}{2}}Nb_{\frac{1}{2}})O_3$, $Pb(Fe_{\frac{1}{2}}Ta_{\frac{1}{2}})O_3$, or $Pb(Fe_{\frac{2}{3}}Te_{\frac{1}{3}})O_3$. The piezoelectric substance has a high electromechanical anistoropy in electromechanical coupling factors, a high electromechanical coupling factor of thickness vibration mode, and a low dielectric constant and serves as a distinguished material for ultrasonic vibrator, etc.

2 Claims, 5 Drawing Figures (a) DRIVE PULSE (b) $\frac{w}{t} = 1.5$ (c) $\frac{w}{t} = 2.5$ (d) $\frac{w}{t} = 3.0$ 1.0 μs/diV.

PIEZOELECTRIC SUBSTANCES

BACKGROUND OF THE INVENTION

This invention relates to piezoelectric substances for use in ultrasonic vibrators, ceramic filters, etc., and particularly in ultrasonic probes for ultrasonic-diagnostic scanners, etc.

Heretofore, the so-called PZT piezoelectric ceramics based on lead zirconate titanate ($PbZrO_3$-$PbTiO_3$) as the main component have been utilized as such kind of piezoelectric ceramics, but when the frequency exceeds 5 MHz, for example, in the ultrasonic probes, the PZT piezoelectric ceramics have a problem in fabricating array transducers, because the PZT ceramics are excited not only in the necessary thickness vibration for generation of ultrasonic waves, but also strongly in the lateral vibration. To drive the vibrator as an ultrasonic probe at the predetermined frequency without any effect of unwanted lateral vibration, the shape of vibrator is restricted, where the thickness of vibrator is determined by the frequency, and the width of vibrator is so determined that no effect of unwanted vibration may be brought about. Suppose the thickness and width of a vibrator are t and w, respectively, in the PZT ceramics, it is known that the vibrator is practically used in the range of $w/t<1$ and the highest efficiency can be obtained in $w/t=0.5-0.8$. To obtain an efficient probe without any influence of the unwanted vibration, a vibrator corresponding to one electrode must be divided into many arrays that are to be driven by one electrode.

The conventional system for dividing an ultrasonic probe vibrator for use at 3.5 MHz with a PZT ceramic into many arrays will be described below, referring to FIG. 1. An array itself can function as a vibrator and thus may be hereinafter referred to also as a vibrator in the specification. Thickness t of vibrator 1 is determined to be 0.4 mm so that the frequency of vibrator may be 3.5 MHz. Since $w/t=0.6$ the optimum width w will be 0.27 in this case. In the probe, a set of three arrays is fixed to one electrode 2 only with such complicated structure that the maximum efficiency can be obtained without any unwanted vibration. In an actual fabrication, electrodes 2 are provided on a vibrator having a large area, and fixed to a backing member 3, and then only the vibrator is divided into arrays by cutting so that three arrays can be provided on each electrode.

The ultrasonic-diagnostic scanner is widely utilized in diagnosis of body organs, etc., because it can display a working image in an actual time with easy manipulation and distinguished safety. Recently, high performance diagnosis not only of body organs but also body surface parts, for example, skin, eye, tissue, etc. has been demanded by further improving the sensitivity or resolving power of a scanner, thereby obtaining improved images. As a step for obtaining improved images, it would be possible to increase the frequency of ultrasonic wave to increase the resolving power. For example, in fabrication of a probe for use at 5 MHz from the PZT ceramics, the width of vibrator is as small as about 0.2 mm, and thus it is quite difficult to divide the vibrator into arrays by cutting to obtain higher frequency arrays.

Recently, $PbTiO_3$ piezoelectric ceramics having a smaller electromechanical coupling factor of unwanted lateral vibration mode kp as a cause for the restriction than the electromechanical coupling factor of necessary thickness vibration mode kt have come to public attention as materials for a high frequency ultrasonic probe. So far, ceramics of $(Pb_1-(3/2xSm_x)(Ti_{1-y}Mn_y)O_3$ system and $(Pb_{1-x}Ca_x)[(Co_{\frac{1}{2}}W_{\frac{1}{2}})_yTi_{1-y}]O_3+M_nO$ system with kp≃0.05 and kt≃0.50 (kt/kp≃10) have been developed and their utility has been found remarkable because the lead titanate ceramics have peculiar characteristic suitable for increasing the frequency as given below:

(1) extremely larger electromechanical coupling factor of thickness vibration mode kt than that of lateral vibration mode kp (i.e. extremely large electromechanical anisotropy of electromechanical coupling factor), for example, $kt/kp=5-10$ and $kt=0.45-0.50$, and (2) low dielectric constant $\epsilon_{33}^T$, for example $\epsilon_{33}^T \simeq 200$. Particularly since kp of the lead titanate ceramics is smaller at least in one order than that of the PZT ceramics as shown in the above (1), the lead titanate ceramics are hardly excited in lateral vibration. That is, the influence of lateral vibration remains low with increasing width of vibrator, and thus the width of vibrator can be much less restricted and vibrators with $w/t=0.5-2.0$ can be used.

FIG. 2 also shows a configuration of divided arrays in a high frequency probe with the conventional lead titanate ceramics, where the same electrodes 2 and backing memebers 3 as used in the PZT ceramics can be used. One vibrator 4 or lead titanate ceramics can be provided at one electrode 2 and its response to pulse wave form has been found substantially equivalent to that of the conventional vibrator.

However, since even the lead titanate ceramics still have such drawbacks that (1) w/t is restricted and (2) kt is as small as 45-50% and thus the sensitivity is low, it has been demanded in the field of ultrasonic probes, etc. to use materials having a larger electromechanical coupling factor ratio kt/kp and, if possible, a larger kt in fabricating a high frequency vibrator.

The following references are cited to show the state of the art; (i) Japanese Patent Application Kokai (Laid-open) No. 55-46620, (ii) Japanese Patent Application Kokai (Laid-Open) No. 55-67370, (iii) Japanese Patent Publication No. 44-26508 and Japanese Patent Publication No. 46-16632.

SUMMARY OF THE INVENTION

An object of the present invention is to provide piezoelectric substances of novel composition having improved characteristics which have been so far regarded as problems of the prior art as described above, that is, a composition having a large electromechanical coupling factor ratio kt/kp, a sufficiently large value of electromechanical coupling factor of thickness vibration mode kt and a low dielectric constant $\epsilon_{33}^T$.

Another object of the present invention is to provide improved piezoelectric substances for use in high frequency ultrasonic probes.

These objects can be attained according to the present invention by providing piezoelectric substances which comprises (i) a binary solid solution having a composition represented by the general formula:

$$xPbZrO_3-yA$$

wherein $0.905 \leq x \leq 0.960$ and $x+y=1.00$, or (ii) a ternary solid solution having a composition represented by the general formula:

$$xPbZrO_3 — yA — zPbTiO_3$$

and having a composition ratio represented by coordinate in a quadrilateral formed by successively connecting point P (x=0.905; y=0.095; z=0.000), point Q (x=0.960; y=0.040; z=0.000), point R (x=0.932; y=0.005; z=0.063), point S (x=0.905; y=0.005; z=0.090) and said P by straight lines, including the respective lines except axis y (that is, the straight line PQ) in a ternary composition diagram showing the composition of said ternary solid solution.

In the foregoing formulae, typical of the substance A is a substance selected from the group consisting of $Pb(Mn_{\frac{1}{3}}Nb_{\frac{2}{3}})O_3$, $Pb(Mn_{\frac{1}{2}}Nb_{\frac{1}{2}})O_3$, $Pb(Fe_{\frac{1}{2}}Sb_{\frac{1}{2}})O_3$, $Pb(Mn_{\frac{1}{2}}Ta_{\frac{1}{2}})O_3$, $Pb(Mn_{\frac{1}{3}}Sb_{\frac{2}{3}})O_3$, $Pb(Mn_{\frac{1}{2}}Sb_{\frac{1}{2}})O_3$, $Pb(Fe_{\frac{1}{2}}Nb_{\frac{1}{2}})O_3$, $Pb(Fe_{\frac{1}{3}}Sb_{\frac{2}{3}})O_3$, $Pb(Mn_{\frac{1}{2}}Ta_{\frac{2}{3}})O_3$, $Pb(Fe_{\frac{1}{3}}Nb_{\frac{2}{3}})O_3$, $Pb(Sb_{\frac{1}{2}}Ta_{\frac{1}{2}})O_3$, $Pb(Fe_{\frac{1}{2}}Ta_{\frac{2}{3}})O_3$, $Pb(Mn_{\frac{2}{3}}W_{\frac{1}{3}})O_3$, $Pb(Sb_{\frac{1}{2}}Nb_{\frac{1}{2}})O_3$, $Pb(Fe_{\frac{1}{2}}Ta_{\frac{1}{2}})O_3$, and $Pb(Fe_{\frac{2}{3}}Ta_{\frac{1}{3}})O_3$.

In addition, the substance A can include $Pb(Li_{\frac{1}{4}}Nb_{\frac{3}{4}})O_3$, $Pb(Li_{\frac{1}{4}}Ta_{\frac{3}{4}})O_3$, $Pb(Li_{\frac{1}{4}}Sb_{\frac{3}{4}})O_3$, $Pb(Mn_{\frac{1}{2}}Bi_{\frac{1}{2}})O_3$, $Pb(Ni_{\frac{1}{2}}Sb_{\frac{1}{2}})O_3$, $Pb(Ni_{\frac{1}{2}}Bi_{\frac{1}{2}})O_3$, $Bi[Mn_{\frac{1}{2}}(Ti.Zr)_{\frac{1}{2}}]O_3$, $La[Mn_{\frac{1}{2}}(Ti,Zr)_{\frac{1}{2}}]O_3$, $Ce[Mn_{\frac{1}{2}}(Ti,Zr)_{\frac{1}{2}}]O_3$, $Tl[Co_{\frac{1}{2}}(Ti,Zr)_{\frac{1}{2}}]O_3$, $Bi[Ni_{\frac{1}{2}}(Ti,Zr)_{\frac{1}{2}}]O_3$, $Ba(Zn_{\frac{1}{3}}Nb_{\frac{2}{3}})O_3$, $Ba(Cd_{\frac{1}{3}}Nb_{\frac{2}{3}})O_3$, $Ba(Mg_{\frac{1}{3}}Nb_{\frac{2}{3}})O_3$, $Sr(Cd_{\frac{1}{3}}Nb_{\frac{2}{3}})O_3$, $Ba(Fe_{\frac{1}{2}}Nb_{\frac{1}{2}})O_3$, $Ba(Sc_{\frac{1}{2}}Nb_{\frac{1}{2}})O_3$, $Ca(Cr_{\frac{1}{2}}Nb_{\frac{1}{2}})O_3$, $La(Mg_{\frac{1}{2}}Ti_{\frac{1}{2}})O_3$, $Nd(Mg_{\frac{1}{2}}Ti_{\frac{1}{2}})O_3$, $(Na_{\frac{1}{2}}La_{\frac{1}{2}})TiO_3$, $(K_{\frac{1}{2}}La_{\frac{1}{2}})TiO_3$, $(Na_{\frac{1}{2}}Ce_{\frac{1}{2}})TiO_3$, $(Na_{\frac{1}{2}}Nd_{\frac{1}{2}})TiO_3$, $(Na_{\frac{1}{2}}Bi_{\frac{1}{2}})TiO_3$, $(K_{\frac{1}{2}}Bi_{\frac{1}{2}})TiO_3$ or other compounds of Ba, Sr, Ca, Bi etc. or other compounds of rare earth elements exemplified by La, Nd, Sm, etc., or other compounds of Sn, Hf, Nb, Ta, Sb, etc. The substance A applicable to the present piezoelectric substances can include so many compounds and it is difficult to enumerate all of the compounds. Other compounds than those enumerated above can be used as the substance A, if such compounds, if presumed to be the substance A, are added to $PbZrO_3$ or $PbZrO_3$-$PbTiO_3$ to provide the composition in the said range, and if the resulting composition is found to be ferroelectric upon investigation of piezoelectric characteristics of the composition. In this case, the resulting composition can have sufficiently large values of kt/kp and kt and a sufficiently low value of $\epsilon_{33}{}^T$.

Pure lead zirconate ceramic ($PbZrO_3$) is an anti-ferroelectric (orthorhombic) having the Curie temperature of 230° C. and has no piezoelectric property. Thus, it has been so far expected that no ferroelectric will be formed by adding such an amount of other substances as in the present composition to $PbZrO_3$ and no piezoelectric property will be obtained thereby. That is, some of piezoelectric ceramic compositions of said binary and ternary solid solutions whose x as given above is less than 0.9 have been already known as piezoelectric ceramics with distinguished resonance frequency against aging. However, it has been presumed that these piezoelectric ceramics will be deteriorated in stability and also deteriorated to an impracticable degree in piezoelectric property when the nominal ratio x of $PbZrO_3$ exceeds 0.9.

The present piezoelectric substances belong to a composition range wherein the nominal ratio of $PbZrO_3$ is 0.905 or higher in the said binary and ternary solid solutions, and are based on extensive investigation of composition ratio and synthesis conditions and the resulting finding of very distinguished piezoelectric characteristics of these piezoelectric substances. Particularly, the present piezoelectric substances have a larger electromechanical anisotropy of electromechanical coupling factors than that of $PbTiO_3$, a sufficiently large electromechanical coupling factor of thickness vibration mode, and a low dielectric constant, and thus can be applied as excellent materials for ultrasonic vibrators or filters for use in high frequency.

Furthermore, the present piezoelectric substances have a mechanical quality factor several times larger than that of $PbTiO_3$, and thus are more convenient for such applications.

The present composition of binary solid solution in the said composition range can provide piezoelectric substances having a low dielectric constant, a large electromechanical anisotropy of electromechanical coupling factors and a large electromechanical coupling factor of thickness vibration mode. If the nominal ratio of $PbZrO_3$ exceeds the said composition range, the ceramic substances turn anti-ferroelectric and usually cannot be used as piezoelectric substances. On the other hand, when the nominal ratio of $PbZrO_3$ is less than the said composition range, the dielectric constant is increased, and also the electromechanical anisotropy of the electromechanical coupling factors is lowered. Thus, this is not preferable.

The present composition of ternary solid solution in the said composition range can provide piezoelectric substances having a low dielectric constant, a small electromechanical coupling factor of laterial vibration mode, and a larger electromechanical coupling factor of thickness vibration mode, and also having other distinguished piezoelectric characteristics. When the nominal ratio of $PbZrO_3$ exceeds the said effective composition range, the ceramics turn anti-ferroelectronics and usually cannot be used as piezoelectric substances. When the nominal ratios of A and $PbTiO_3$ exceed the said effective composition ranges, the dielectric constant is increased. This is not preferable. In addition, some ceramics have a large mechanical quality factor, and also the electromechanical coupling factor of lateral vibration mode kp is increased, and the electromechanical coupling ratio is decreased. This is not preferable.

A ceramic composition having a nominal ratio of A of less than 0.005, that is, a composition similar to that of the so far known PZT ceramics has considerable vaporization of PbO when sintered, so that no stable ceramic can be obtained. Also, the electric resistance is decreased, so that its polarization treatment can be hard to conduct. Thus, the characteristics become unstable and the electromechanical coupling factor of thickness vibration mode is effectively lowered. These are unpreferable disadvantages.

FIG. 3 is a ternary composition diagram showing the said composition range of the present piezoelectric substance where points showing nominal ratios of compositions shown in the respective Examples are also indicated.

Ultrasonic probes with vibrators prepared from the present piezoelectric substances are much less restricted in the width of vibrators and are applicable with ultrasonic waves of higher frequency than the ultrasonic probes of said prior art. As compared with the conventional ultrasonic probes at an equal frequency, the vibrators with the present piezoelectric substances can have a larger width, and thus can be readily fabricated and performed with a good efficiency.

DESCRIPTION OF THE PREFERRED EMBODIMENTS OF THE INVENTION

EXAMPLE 1

Figure 1:
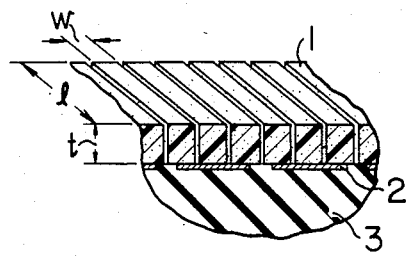
FIGS. 1 and 2 are schematic views of structures of vibrators and other members of an ultrasonic probe.

In Table 1, Samples Nos. 1–7 of binary solid solutions of $PbZrO_3$-$Pb(Mn_{\frac{1}{3}}Nb_{\frac{2}{3}})O_3$ are summarized. The starting material for use in the present piezoelectric substances are powders each of lead oxide (PbO), zirconium oxide ($ZrO_2$), manganese oxide (MnO) and niobium oxide ($Nb_2O_5$), and having a purity of at least 99.9%, unless otherwise specified.

Powders of the starting materials in composition ratios shown in Table 1 are wet mixed in a ball mill for about one hour, dried, and calcined at 900° C. for 2 hours. The calcined products are each pulverized in a pulverizer and mixed again in a ball mill. After drying, the powders are press shaped under the pressure of 350 kg/cm$^2$ and sintered at 1,250° C.–1,280° C. for 5 hours. The sintered products have a size of 16 mm in diameter and 10 mm thick. The sintered products are cut to a thickness of about 1 mm, and lapped to a thickness of 0.8 mm. Then, Cr-Au is vapor deposited to both sides of the sintered products as electrodes. Then, copper lead wires are provided to the electrodes by means of a silver paste, and the sintered products are subjected to polarization treatment by applying a DC voltage of 20-60 kV/cm thereto in silicone oil at 70°–150° C. for 10 minutes. Then, dielectric characteristic and piezoelectric characteristics are measured.

As is obvious from Samples Nos. 1–4 of Table 1, the present piezoelectric substances have a low dielectric constant such as less than 200, and a large electromechanical anisotropy of electromechanical coupling factors such as more than 10. Furthermore, some has a larger electromechanical coupling factor of thickness vibration mode kt than 0.55, which are characteristically larger than that of $PbTiO_3$ ceramics. The molar ratio of $PbZrO_3$ (i.e. x) in a range of 0.93 to 0.95 produces particularly good characteristics.

Samples Nos. 5 and 6 show that the molar ratio of $Pb(Mn_{\frac{1}{3}}Nb_{\frac{2}{3}})O_3$ exceeds 0.10, where the dielectric constant is increased, and the electromechanical coupling factor of lateral vibration mode is increased, resulting in a decrease in the electromechanical anisotropy.

Sample No. 7 shows that the nominal ratio of $PbZrO_3$ exceeds 0.96, where the resulting ceramic composition turns an anti-ferroelectric. Thus, it is impossible to obtain a piezoelectric activity by polarization treatment, and Sample No. 7 cannot be used as the piezoelectric substance. The crystal system of ceramic compositions that turn anti-ferroelectric is a orthorhombic system, whereas the crystal system of the present ceramic compositions having excellent piezoelectric characteristic is a rhombohedral system.

EXAMPLE 2

Excellent characteristics of binary solid solution of $PbZrO_3$-$Pb(Mn_{\frac{1}{3}}Nb_{\frac{2}{3}})O_3$ can be retained in ternary solid solutions of $PbZrO_3$-$Pb(Mn_{\frac{1}{3}}Nb_{\frac{2}{3}})O_3$-$PbTiO_3$ where $PbTiO_3$ is contained in the said binary solid solution, and the mechanical quality factor is increased.

Samples can be prepared in the same manner as in Example 1, where titanium oxide ($TiO_2$) is used as the starting material for titanium (Ti).

In Table 2, Samples Nos. 8–28 are summarized. As is obvious from Samples Nos. 8–15, the ceramic compositions have a very large electromechanical coupling factor and a very large mechanical quality factor, and most compositions have a low dielectric constant. The electromechanical coupling factor of thickness vibration mode is more improved than that of the binary solid solution of $PbZrO_3$-$Pb(Mn_{\frac{1}{3}}Nb_{\frac{2}{3}})O_3$.

Samples Nos. 16–21 show that the nominal ratio of $PbZrO_3$ is smaller than the said effective nominal ratio, i.e. the nominal ratios of $Pb(Mn_{\frac{1}{3}}Nb_{\frac{2}{3}})O_3$ and $PbTiO_3$ are larger. All of the ceramic compositions have a large dielectric constant and a small electromechanical anisotropy of electromechanical coupling factors.

Samples Nos. 22–24 show that the nominal ratio of $PbZrO_3$ is larger than that of the present invention, and all of the ceramic compositions are anti-ferroelectric.

Ultimately, Samples Nos. 25–28 are the so-called $PbZrO_3$-$PbTiO_3$ ceramic compositions containing no $Pb(Mn_{\frac{1}{3}}Nb_{\frac{2}{3}})O_3$ among which Samples Nos. 25 and 26 are anti-ferroelectric and Samples Nos. 27 and 28 have a small electromechanical coupling factor of thickness vibration mode.

Figure 3:
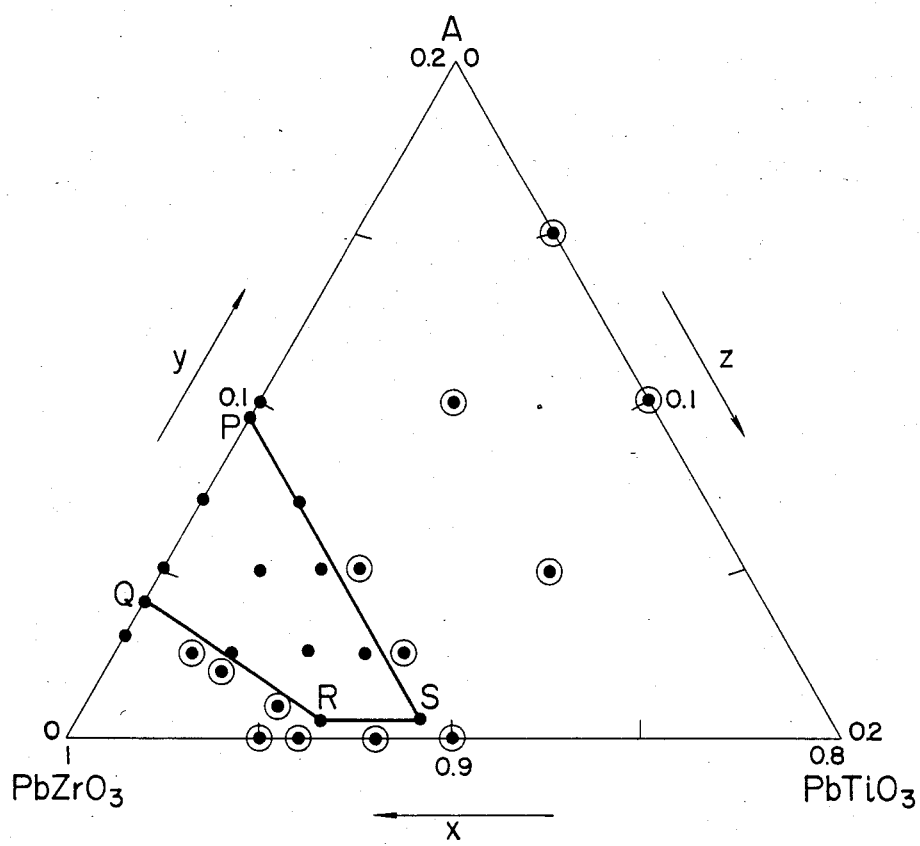
FIG. 3 is a ternary composition diagram showing composition range of the present piezoelectric substances and composition ratios of piezoelectric substances in the respective Examples.

The compositions shown in the foregoing Examples correspond to the compositions shown by black circles in FIG. 3. In FIG. 3, marks " • " show sample compositions used only in the foregoing Examples 1 and 2, and mark "•" show composition points common to the samples used in the foregoing Examples 1 and 2 and the samples used in the following Examples.

EXAMPLE 3

In Table 3, Samples Nos. 1–7 of binary solid solutions of $PbZrO_3$-$Pb(Mn_{\frac{1}{2}}Nb_{\frac{1}{2}})O_3$ are summarized, and the starting materials for use in the present ceramic compositions are powders each of lead oxide (PbO), zirconium oxide ($ZrO_2$), manganese oxide (MnO) and niobium oxide ($Nb_2O_5$), each having a purity of at least 99.9%, unless otherwise specified. Samples are prepared in the same manner as in Example 1.

As is obvious from Samples Nos. 1–4 in Table 3, the present piezoelectric substances have a small dielectric constant such as less than 200, and a large electromechanical anisotropy of electromechanical coupling factors such as more than 10. Some substances have an electromechanical coupling factor of thickness vibration mode kt of more than 0.55, which are characteristically larger than that of the $PbTiO_3$ ceramic composition.

Samples Nos. 5 and 6 show that the nominal ratio of $Pb(Mn_{\frac{1}{2}}Nb_{\frac{1}{2}})O_3$ exceeds 0.10, where the dielectric constant is increased and the electromechanical coupling factor of lateral vibration mode is increased, resulting in a decrease in the electromechanical anisotropy.

Sample No. 7 shows that the nominal ratio of $PbZrO_3$ exceeds 0.96, where the resulting ceramic composition turns an anti-ferroelectronic, and thus it is impossible to obtain a piezoelectric activity by polarization treatment, in other words, the composition cannot be used as a piezoelectric substance. The crystal system of ceramic compositions that turn anti-ferroelectric are an orthorhombic system, whereas the crystal system of the present ceramic compositions having excellent piezoelectric characteristics is a rhombohedral system. In the following Examples, the crystal system of anti-ferroelectric and that of ceramic compositions having excellent piezoelectric characteristics are an orthorhombic system and a rhombohedral system, respectively, as in the present Example, unless otherwise mentioned.

EXAMPLE 4

The distinguished characteristics of binary solid solution of $PbZrO_3\text{-}Pb(Mn_{\frac{1}{3}}Nb_{\frac{2}{3}})O_3$ can be retained also in ternary solid solutions of $PbZrO_3\text{-}Pb(Mn_{\frac{1}{3}}Nb_{\frac{2}{3}})O_3\text{-}PbTiO_3$, where $PbTiO_3$ is contained in the binary solid solution and the mechanical quality factor can be increased.

Samples can be prepared in the same manner as in Example 1, where titanium oxide ($TiO_2$) is used as the starting material for titanium (Ti). In the following Examples, titanium oxide ($TiO_2$) is used as the starting material for titanium (Ti) as in the present Example, unless otherwise mentioned.

In Table 4, Samples Nos. 8–15 are summarized. As is obvious from each of Samples, each Sample has very large electromechanical coupling factor and mechanical quality factor, and most compositions have a low dielectric constant. The electromechanical coupling factor of thickness vibration mode is more improved than that of the binary solid solutions of $PbZrO_3\text{-}Pb(Mn_{\frac{1}{3}}Nb_{\frac{2}{3}})O_3$.

When the nominal ratio of $PbZrO_3$ is smaller than the said effective nominal ratio, that is, when the nominal ratios of $Pb(Mn_{\frac{1}{3}}Nb_{\frac{2}{3}})O_3$ and $PbTiO_3$ are larger, the dielectric constant is increased, and the electromechanical anisotropy of electromechanical coupling factors is decreased when the nominal ratio of $PbZrO_3$ exceeds the present composition range, and the ceramic compositions turn anti-ferroelectric.

The so-called $PbZrO_3\text{-}PbTiO_3$ ceramic compositions containing no $Pb(Mn_{\frac{1}{3}}Nb_{\frac{2}{3}})O_3$ have a small electromechanical coupling factor of thickness vibration mode.

Sample compositions of the foregoing Examples 3 and 4 and the following Examples are shown in FIG. 3.

EXAMPLE 5

In Table 5, Samples Nos. 1–7 of binary solid solution of $PbZrO_3\text{-}Pb(Fe_{\frac{1}{2}}Sb_{\frac{1}{2}})O_3$ are summarized. The starting materials for use in the present ceramic compositions are powders each of lead oxide (PbO), zirconium oxide ($ZrO_2$), iron oxide ($Fe_2O_3$) and antimony oxide ($Sb_2O_5$) each having a purity of at least 99.9%, unless otherwise specified. Samples are prepared in the same manner as in Example 1.

As is obvious from samples Nos. 1–4 in Table 5, the piezoelectric substances have a low dielectric constant such as about 200, and a large electromechanical anisotropy of thickness vibration mode such as more than 10. Some substances have an electromechanical coupling factor of thickness vibration mode of more than 0.55, which is characteristically larger than that of the $PbTiO_3$ ceramic compositions.

Samples Nos. 5 and 6 show that the nominal ratio of $Pb(Fe_{\frac{1}{2}}Sb_{\frac{1}{2}})O_3$ exceeds 0.10, where the dielectric constant is increased, and the electromechanical coupling fator of lateral vibration mode is increased, resulting in a decrease in the electromechanical anisotropy.

Sample No. 7 shows that the nominal ratio of $PbZrO_3$ exceeds 0.96, where the resulting ceramic composition turns anti-ferroelectric.

EXAMPLE 6

The distinguished characteristics of binary solid solution of $PbZrO_3\text{-}Pb(Fe_{\frac{1}{2}}Sb_{\frac{1}{2}})O_3$ can be retained also in ternary solid solutions of $PbZrO_3\text{-}Pb(Fe_{\frac{1}{2}}Sb_{\frac{1}{2}})O_3\text{-}PbTiO_3$, where $PbTiO_3$ is contained in the binary solid solution.

Samples are prepared in the same manner as in Example 1. In Table 6, Samples Nos. 8–15 are summarized. As is obvious from each of samples, each ceramic composition has a very high electromechanical coupling factor, and most compositions have a low dielectric constant. The electromechanical coupling factor of thickness vibration mode is more improved than that of the binary composition of $PbZrO_3\text{-}Pb(Fe_{\frac{1}{2}}Sb_{\frac{1}{2}})O_3$.

When the nominal ratio of $PbZrO_3$ is smaller than the said nominal ratio, that is, when the nominal ratios of $Pb(Fe_{\frac{1}{2}}Sb_{\frac{1}{2}})O_3$ and $PbTiO_3$ are larger, the dielectric constant is increased, and the electromechanical anisotropy of electromechanical coupling factors is decreased.

When the nominal ratio of $PbZrO_3$ is larger than the present composition range, the resulting ceramic composition turns anti-ferroelectric.

Ultimately, the so-called ceramic compositions of $PbZrO_3\text{-}PbTiO_3$ containing no $Pb(Fe_{\frac{1}{2}}Sb_{\frac{1}{2}})O_3$ have a small electromechanical coupling factor of thickness vibration mode.

EXAMPLE 7

In Table 7, Samples Nos. 1–7 of binary solid solutions of $PbZrO_3\text{-}Pb(Mn_{\frac{1}{3}}Ta_{\frac{2}{3}})O_3$ are summarized. The starting materials for use in the present ceramic compositions are powders each of lead oxide (PbO), zirconium oxide ($ZrO_2$), manganese oxide (MnO) and tantalum oxide ($Ta_2O_5$), each having a purity of at least 99.9%, unless otherwise specified. Samples are prepared in the same manner as in Example 1.

As is obvious from Samples Nos. 1–4 in Table 7, these piezoelectric substances have a low dielectric constant such as 200, and a large electromechanical anisotropy of electromechanical coupling factors such as more than 10. Some compositions have an electromechanical coupling factor of thickness vibration mode of more than 0.55, which is characteristically larger than that of the $PbTiO_3$ ceramic composition.

Samples Nos. 5 and 6 show that the nominal ratio of $Pb(Mn_{\frac{1}{3}}Ta_{\frac{2}{3}})O_3$ exceeds 0.10, where the dielectric constant is increased, and the electromechanical coupling factor of lateral vibration mode is increased, resulting in a decrease in the electromechanical anisotropy.

Sample No. 7 shows that the nominal ratio of $PbZrO_3$ exceeds 0.96, where the resulting ceramic composition turns an anti-ferroelectric.

EXAMPLE 8

The distinguished characteristics of binary solid solutions of $PbZrO_3\text{-}Pb(Mn_{\frac{1}{3}}Ta_{\frac{2}{3}})O_3$ can be retained also in ternary solid solutions of $PbZrO_3$-$Pb(Mn_{\frac{1}{3}}Ta_{\frac{1}{3}})O_3$-$PbTiO_3$, where $PbTiO_3$ is contained in the binary solid solution and the mechanical quality factor is increased.

Samples are prepared in the same manner as in Example 1. In Table 8, Samples Nos. 8–15 are summarized. As is obvious from each of Samples, the electromechanical coupling factors and mechanical quality factor are much increased, and most ceramic compositions have a low dielectric constant. The electromechanical coupling factor of thickness vibration mode is more improved than that of the binary solid solution of $PbZrO_3$-$Pb(Mn_{\frac{1}{3}}Ta_{\frac{1}{3}})O_3$.

When the nominal ratio of $PbZrO_3$ is smaller than the said effective composition ratio, that is, when the nominal ratios of $Pb(Mn_{\frac{1}{3}}Ta_{\frac{1}{3}})O_3$ and $PbTiO_3$ are larger, the dielectric constant is increased and the electromechanical anisotropy of electromechanical coupling factors is decreased.

When the nominal ratio of $PbZrO_3$ is larger than the composition range of the present invention, the resulting ceramic compositions turn anti-ferroelectronics.

Ultimately, the so-called $PbZrO_3$-$PbTiO_3$ ceramic compositions containing no $Pb(Mn_{\frac{1}{3}}Ta_{\frac{1}{3}})O_3$ have a small electromechanical coupling factor of thickness vibration mode.

EXAMPLE 9

In Table 9, Samples Nos. 1–7 of binary solid solutions of $PbZrO_3$-$Pb(Mn_{\frac{1}{3}}Sb_{\frac{2}{3}})O_3$ are summarized. The starting materials for use in the present ceramic compositions are powders each of lead oxide (PbO), zirconium oxide ($ZrO_2$), manganese oxide (MnO) and antimony oxide ($Sb_2O_5$), each having a purity of at least 99.9%, unless otherwise specified. Samples are prepared in the same manner as in Example 1.

As is obvious from Samples Nos. 1–4 in Table 9, the piezoelectric compositions of this example have a low dielectric constant such as about 200, and a large electromechanical anisotropy of electromechanical coupling factors such as more than 10. Some substances have an electromechanical coupling factor of thickness vibration mode kt of more than 0.55, which is characteristically larger than that of the $PbTiO_3$ ceramic composition.

Samples Nos. 5 and 6 show that the nominal ratio of $Pb(Mn_{\frac{1}{3}}Sb_{\frac{2}{3}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns an anti-ferroelectric.

EXAMPLE 10

The distinguished characteristics of the binary solid solutions of $PbZrO_3$-$Pb(Mn_{\frac{1}{3}}Sb_{\frac{2}{3}})O_3$ can be retained also in ternary solid solutions of $PbZrO_3$-$Pb(Mn_{\frac{1}{3}}Sb_{\frac{2}{3}})O_3$-$PbTiO_3$, where $PbTiO_3$ is contained in the binary solid solutions and the mechanical quality factor is increased.

Samples are prepared in the same manner as in Example 1, and Samples Nos. 8–15 are summarized in Table 10.

As is obvious from each of Samples, each ceramic composition has very large electromechanical coupling factors and mechanical quality factor, and most compositions have a low dielectric constant. The electromechanical coupling factor of thickness vibration mode is more improved than that of the binary solid solutions of $PbZrO_3$-$Pb(Mn_{\frac{1}{3}}Sb_{\frac{2}{3}})O_3$.

When the nominal ratio of $PbZrO_3$ is smaller than the said effective composition ratio, that is, when the nominal ratios of $Pb(Mn_{\frac{1}{3}}Sb_{\frac{2}{3}})O_3$ and $PbTiO_3$ are larger, the dielectric constant is increased, and the electromechanical anisotropy of electromechanical coupling factors is decreased.

When the nominal ratio of $PbZrO_3$ is larger than the composition range of the present invention, the resulting ceramic compositions turn anti-ferroelectric.

Ultimately, the so-called $PbZrO_3$-$PbTiO_3$ ceramic compositions containing no $Pb(Mn_{\frac{1}{3}}Sb_{\frac{2}{3}})O_3$ have a small electromechanical coupling factor of thickness vibration mode.

EXAMPLE 11

In Table 11, Samples Nos. 1–7 of binary solid solutions of $PbZrO_3$-$Pb(Mn_{\frac{1}{2}}Sb_{\frac{1}{2}})O_3$ are summarized. The starting materials for use in the present ceramic compositions are powders each of lead oxide (PbO), zirconium oxide ($ZrO_2$), manganese oxide (MnO) and antimony oxide ($Sb_2O_5$), each having a purity of at least 99.9%, unless otherwise specified. Samples are prepared in the same manner as Example 1.

As is obvious from Samples Nos. 1–4 in Table 11, the piezoelectric substances of this Example have a low dielectric constant such as about 200, and a large electromechanical anisotropy of electromechanical coupling factors. Some substances have an electromechanical coupling factor of thickness vibration mode kt of more than 0.53, which is characteristically larger than that of the $PbTiO_3$ ceramic compositions.

Samples Nos. 5 and 6 show that the nominal ratio of $Pb(Mn_{\frac{1}{2}}Sb_{\frac{1}{2}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns anti-ferroelectric.

EXAMPLE 12

The distinguished characteristics of binary solid solutions of $PbZrO_3$-$Pb(Mn_{\frac{1}{2}}Sb_{\frac{1}{2}})O_3$ can be retained also in ternary solid solutions of $PbZrO_3$-$Pb(Mn_{\frac{1}{2}}Sb_{\frac{1}{2}})O_3$-$PbTiO_3$, where $PbTiO_3$ is contained in the binary solid solution, and the mechanical quality factor is increased. Samples are prepared in the same manner as in Example 1. Samples No. 8–15 are summarized in Table 12.

As is obvious from each of Samples, each ceramic composition has very large electromechanical coupling factors and mechanical quality factor, and most compositions have a low dielectric constant. The electromechanical coupling factor of thickness vibration mode is more improved than that of the binary solid solutions of $PbZrO_3$-$Pb(Mn_{\frac{1}{2}}Sb_{\frac{1}{2}})O_3$.

When the nominal ratio of $PbZrO_3$ is smaller than the said effective composition ratio, that is, when the nominal ratios of $Pb(Mn_{\frac{1}{2}}Sb_{\frac{1}{2}})O_3$ and $PbTiO_3$ are larger, the dielectric constant is increased, and the electromechanical anisotropy of electromechanical coupling factors is decreased.

When the nominal ratio of $PbZrO_3$ is larger than the composition ratio of the present invention, the resulting ceramic compositions turn anti-ferroelectric.

Ultimately, the so-called $PbZrO_3$-$PbTiO_3$ ceramic compositions having no $Pb(Mn_{\frac{1}{2}}Sb_{\frac{1}{2}})O_3$ have a small electromechanical coupling factor of thickness vibration mode.

EXAMPLE 13

In Table 13, Samples Nos. 1–7 of binary solid solutions of $PbZrO_3$-$Pb(Fe_{\frac{1}{2}}Nb_{\frac{1}{2}})O_3$ are summarized. Starting materials for use in the present ceramic compositions are powders each of lead oxide (PbO), zirconium oxide ($ZrO_2$), iron oxide ($Fe_2O_3$) and niobium oxide ($Nb_2O_5$), each having a purity of at least 99.9%, unless otherwise specified. Samples are prepared in the same manner as in Example 1.

As is obvious from Samples Nos. 1–4 of Table 13, the piezoelectric substances of this Example have a low dielectric constant such as about 200, and a large electromechanical anisotropy of electromechanical coupling factors such as more than 10. Some substances have an electromechanical coupling factor of thickness vibration mode kt of more than 0.55, which is characteristically larger than that of the $PbTiO_3$ ceramic compositions.

Samples Nos. 5 and 6 show that the nominal ratio of $Pb(Fe_{\frac{1}{2}}Nb_{\frac{1}{2}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns an anti-ferroelectric.

EXAMPLE 14

The distinguished characteristics of the binary solid solutions of $PbZrO_3$-$Pb(Fe_{\frac{1}{2}}Nb_{\frac{1}{2}})O_3$ can be retained also in ternary solid solutions of $PbZrO_3$-$Pb(Fe_{\frac{1}{2}}Nb_{\frac{1}{2}})O_3$-$PbTiO_3$, where $PbTiO_3$ is contained in the binary composition. Samples are prepared in the same manner as in Example 1. In Table 14, Samples Nos. 8–15 are summarized.

As is obvious from each of Samples, each ceramic composition has very large electromechanical coupling factors, and most compositions have a low dielectric constant. The electromechanical coupling factor of thickness vibration mode is more improved than that of the binary solid solutions of $PbZrO_3$-$Pb(Fe_{\frac{1}{2}}Nb_{\frac{1}{2}})O_3$.

When the nominal ratio of $PbZrO_3$ is smaller than the said effective composition ratio, that is, when the nominal ratios of $Pb(Fe_{\frac{1}{2}}Nb_{\frac{1}{2}})O_3$ and $PbTiO_3$ are larger, the dielectric constant is increased and the electromechanical anisotropy of electromechanical coupling factors is decreased.

When the nominal ratio of $PbZrO_3$ is larger than the composition range of the present invention, the resulting ceramic compositions turn anti-ferroelectric.

Ultimately, the so-called $PbZrO_3$-$PbTiO_3$ ceramic compositions containing no $Pb(Fe_{\frac{1}{2}}Nb_{\frac{1}{2}})O_3$ have a small electromechanical coupling factor of thickness vibration mode.

EXAMPLE 15

In Table 15, Samples Nos. 1–7 of binary solid solutions of $PbZrO_3$-$Pb(Fe_{\frac{1}{2}}Sb_{\frac{2}{3}})O_3$ are summarized. The starting materials for use in the present ceramic compositions are powders each of lead oxide (PbO), zirconium oxide ($ZrO_2$), iron oxide ($Fe_2O_3$), and antimony oxide ($Sb_2O_5$), each having a purity of at least 99.9%, unless otherwise specified. Samples are prepared in the same manner as in Example 1.

As is obvious from Samples Nos. 1–4 of Table 15, the piezoelectric substances of this Example have a low dielectric constant such as about 200, and a large electromechanical anisotropy of electromechanical coupling factors such as more than 10. Some substances have a electromechanical coupling factor of thickness vibration mode kt of more than 0.55, which is characteristically larger than that of the $PbTiO_3$ ceramic compositions.

Samples Nos. 5 and 6 show that the nominal ratio of $Pb(Fe_{\frac{1}{2}}Sb_{\frac{2}{3}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns anti-ferroelectric.

EXAMPLE 16

The distinguished characteristics of binary solid solutions of $PbZrO_3$-$Pb(Fe_{\frac{1}{2}}Sb_{\frac{2}{3}})O_3$ can be retained also in ternary solid solutions of $PbZrO_3$-$Pb(Fe_{\frac{1}{2}}Sb_{\frac{2}{3}})O_3$-$PbTiO_3$, where $PbTiO_3$ is contained in the binary solid solution. Samples are prepared in the same manner as in Example 1. In Table 16, Samples Nos. 8–15 are summarized.

As is obvious from each of Samples, each ceramic composition has very large electromechanical coupling factor, and most compositions have a small dielectric constant. The electromechanical coupling factor of thickness vibration mode is more improved than that of the binary solid solutions of $PbZrO_3$-$Pb(Fe_{\frac{1}{2}}Sb_{\frac{2}{3}})O_3$.

When the nominal ratio of $PbZrO_3$ is smaller than the said effective composition ratio, that is, when the nominal ratios of $Pb(Fe_{\frac{1}{2}}Sb_{\frac{2}{3}})O_3$ and $PbTiO_3$ are larger, the dielectric constant is increased, and the electromechanical anisotropy of electromechanical coupling factors is decreased.

When the nominal ratio of $PbZrO_3$ is larger than the composition range of the present invention, the resulting ceramic compositions turn anti-ferroelectric.

Ultimately, the so-called $PbZrO_3$-$PbTiO_3$ ceramic compositions containing no $Pb(Fe_{\frac{1}{2}}Sb_{\frac{2}{3}})O_3$ have a small electromechanical coupling factor of thickness vibration mode.

EXAMPLE 17

In Table 17, Sample Nos. 1–7 of binary solid solutions of $PbZrO_3$-$Pb(Mn_{\frac{1}{3}}Ta_{\frac{2}{3}})O_3$ are summarized. The starting materials for use in the present ceramic compositions are powders each of lead oxide (PbO), zirconium oxide ($ZrO_2$), manganese oxide (MnO) and tantalum oxide ($Ta_2O_5$), each having a purity of at least 99.9%, unless otherwide specified. Samples are prepare in the same manner as in Example 1.

As is obvious from Samples Nos. 1–4 of Table 17, the piezoelectric substances of this Example have a low dielectric constant such as less than 200, and a large electromechanical anisotropy of electromechanical coupling factors such as more than 10. Some substances have an electromechanical coupling factor of thickness vibration mode kt of more than 0.55, which is characteristically larger than that of the $PbTiO_3$ ceramic compositions.

Samples Nos. 5 and 6 show that the nominal ratio of $Pb(Mn_{\frac{1}{3}}Ta_{\frac{2}{3}})O_3$ exceeds 1.0, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns an anti-ferroelectric.

EXAMPLE 18

The distinguished characteristics of the binary solid solutions of $PbZrO_3$-$Pb(Mn_{\frac{1}{3}}Ta_{\frac{2}{3}})O_3$ can be retained also in ternary solid solutions of $PbZrO_3$-$Pb(Mn_{\frac{1}{3}}Ta_{\frac{2}{3}})O_3$-$PbTiO_3$, where $PbTiO_3$ is contained in the binary solid solution, and the mechanical quality factor is increased. Samples are prepared in the same manner as in Example 1. In Table 18, Samples Nos. 8-15 are summarized.

As is obvious from each of Samples, each ceramic composition has very large electromechanical coupling factors and mechanical quality factor, and most compositions have a low dielectric constant. The electromechanical coupling factor of thickness vibration mode is more improved than that of the binary solid solutions of $PbZrO_3$-$Pb(Mn_{\frac{1}{3}}Ta_{\frac{2}{3}})O_3$.

When the nominal ratio of $PbZrO_3$ is smaller than the said effective composition ratio, that is, when the nominal ratios of $Pb(Mn_{\frac{1}{3}}Ta_{\frac{2}{3}})O_3$ and $PbTiO_3$ are larger, the dielectric constant is increased, and the electromechanical anisotropy of electromechanical coupling factors is decreased.

When the nominal ratio of $PbZrO_3$ is larger than the composition range of the present invention, the resulting ceramic compositions turn anti-ferroelectric.

Ultimately, the so-called $PbZrO_3$-$PbTiO_3$ ceramic compositions containing no $Pb(Mn_{\frac{1}{3}}Ta_{\frac{2}{3}})O_3$ have a small electromechanical coupling factor of thickness vibration mode.

EXAMPLE 19

In Table 19, Samples Nos. 1-7 of binary solid solutions of $PbZrO_3$-$Pb(Fe_{\frac{1}{3}}Nb_{\frac{2}{3}})O_3$ are summarized. The starting materials for use in the present ceramic compositions are powders each of lead oxide (PbO), zirconium oxide ($ZrO_2$), iron oxide ($Fe_2O_3$) and niobium oxide ($Nb_2O_5$), each having a purity of at least 99.9%, unless otherwise specified. Samples are prepared in the same manner as in Example 1.

As is obvious from Samples Nos. 1-4 of Table 19, the piezoelectric substances of this Example have a low dielectric constant such as about 200, and a large electromechanical anisotropy of electromechanical coupling factors such as more than 10. Some compositions have an electromechanical coupling factor of thickness vibration mode kt of more than 0.55, which is characteristically larger than that of the $PbTiO_3$ ceramic compositions.

Samples Nos. 5 and 6 show that the nominal ratio of $Pb(Fe_{\frac{1}{3}}Nb_{\frac{2}{3}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns an anti-ferroelectronic.

EXAMPLE 20

The distinguished characteristics of the binary solid solution of $PbZrO_3$-$Pb(Fe_{\frac{1}{3}}Nb_{\frac{2}{3}})O_3$ can be retained also in ternary solid solutions of $PbZrO_3$-$Pb(Fe_{\frac{1}{3}}Nb_{\frac{2}{3}})O_3$-$PbTiO_3$, where $PbTiO_3$ is contained in the binary solid solution. Samples are prepared in the same manner as in Example 1.

In Table 20, Samples Nos. 8-15 are summarized.

As is obvious from each of Samples, each ceramic composition has very large electromechanical coupling factors and most compositions have a small dielectric constant. The electromechanical coupling factor of thickness vibration mode is more improved than that of the binary solid solutions of $PbZrO_3$-$Pb(Fe_{\frac{1}{3}}Nb_{\frac{2}{3}})O_3$.

When the nominal ratio of $PbZrO_3$ is smaller than the said effective composition ratio, that is, when the nominal ratios of $Pb(Fe_{\frac{1}{3}}Nb_{\frac{2}{3}})O_3$ and $PbTiO_3$ are larger, the dielectric constant is increased, and the electromechanical anisotropy of electromechanical coupling factors is decreased.

When the nominal ratio of $PbZrO_3$ is larger than the composition range of the present invention, the resulting ceramic compositions turn anti-ferroelectronics.

Ultimately, the so-called $PbZrO_3$-$PbTiO_3$ ceramic compositions containing no $Pb(Fe_{\frac{1}{3}}Nb_{\frac{2}{3}})O_3$ have a small electromechanical coupling factor of thickness vibration mode.

EXAMPLE 21

In Table 21, Samples Nos. 1-7 of binary solid solutions of $PbZrO_3$-$Pb(Sb_{\frac{1}{2}}Ta_{\frac{1}{2}})O_3$ are summarized. The starting materials for use in the present ceramic compositions are powders each of lead oxide (PbO), zirconium oxide ($ZrO_2$), antimony oxide ($Sb_2O_3$) and tantalum oxide ($Ta_2O_5$), each having a purity of at least 99.9%, unless otherwise specified. Samples are prepared in the same manner as in Example 1.

As is obvious from Samples Nos. 1-4 of Table 21, the piezoelectric substances of this Example have a low dielectric constant such as less than 200, and a large electromechanical anisotropy of electromechanical coupling factors such as more than 10. Some substances have an electromechanical coupling factor of thickness vibration mode kt of more than 0.55, which is characteristically larger than that of the $PbTiO_3$ ceramic compositions.

Samples Nos. 5 and 6 show that the nominal ratio of $Pb(Sb_{1/2}Ta_{1/2})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns an anti-ferroelectronic.

EXAMPLE 22

The distinguished characteristics of binary solid solutions of $PbZrO_3$-$Pb(Sb_{\frac{1}{2}}Ta_{\frac{1}{2}})O_3$ can be retained also in ternary solid solutions of $PbZrO_3$-$Pb(Sb_{\frac{1}{2}}Ta_{\frac{1}{2}})O_3$-$PbTiO_3$, where $PbTiO_3$ is contained in the binary solid solution. Samples are prepared in the same manner as in Example 1.

In Table 22, Samples Nos. 8-15 are summarized.

As is obvious from each of Samples, each ceramic composition has very large electromechanical coupling factors and most compositions have a small dielectric constant. The electromechanical coupling factor of thickness vibration mode is more improved than that of the binary solid solutions of $PbZrO_3$-$Pb(Sb_{\frac{1}{2}}Ta_{\frac{1}{2}})O_3$.

When the nominal ratio of $PbZrO_3$ is smaller than the said effective composition ratio, that is, when the nominal ratios of $Pb(Sb_{\frac{1}{2}}Ta_{\frac{1}{2}})O_3$ and $PbTiO_3$ are larger, the dielectric constant is increased, and the electromechanical anisotropy of electromechanical coupling factors is decreased.

When the nominal ratio of $PbZrO_3$ is larger than the composition range of the present invention, the resulting ceramic compositions turn anti-ferroelectric.

Ultimately, the so-called $PbZrO_3$-$PbTiO_3$ ceramic compositions containing no $Pb(Sb_{\frac{1}{2}}Ta_{\frac{1}{2}})O_3$ have a small electromechanical coupling factor of thickness vibration mode.

EXAMPLE 23

In Table 23, Samples Nos. 1-7 of binary solid solution of $PbZrO_3$-$Pb(Fe_{\frac{1}{3}}Ta_{\frac{2}{3}})O_3$ are summarized. The starting materials for use in the present ceramic compositions are powders each of lead oxide (PbO), zirconium oxide ($ZrO_2$), iron oxide ($Fe_2O_3$) and tantalum oxide ($Ta_2O_5$), each having a purity of at least 99.9%, unless otherwise mentioned. Samples are prepared in the same manner as in Example 1.

As is obvious from Samples Nos. 1-4 of Table 23, the piezoelectric substances of this Example have a low dielectric constant such as about 200, and a large electromechanical anisotropy of electromechanical coupling factors such as more than 10. Some compositions have an electromechanical coupling factor of thickness vibration mode kt of more than 0.55, which is characteristically larger than that of $PbTiO_3$.

Samples Nos. 5 and 6 show that the nominal ratio of $Pb(Fe_{\frac{1}{3}}Ta_{\frac{2}{3}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns anti-ferroelectric.

EXAMPLE 24

The distinguished characteristics of binary solid solutions of $PbZrO_3$-$Pb(Fe_{\frac{1}{3}}Ta_{\frac{2}{3}})O_3$ can be retained also in ternary solid solutions of $PbZrO_3$-$Pb(Fe_{\frac{1}{3}}Ta_{\frac{2}{3}})$-$O_3$-$PbTiO_3$, where $PbTiO_3$ is contained in the binary solid solution. Samples are prepared in the same manner as in Example 1. In Table 24, Samples Nos. 8-15 are summarized.

As is obvious from each of Samples, each ceramic composition has large electromechanical coupling factors, and most compositions have a low dielectric constant. The electromechanical coupling factor of thickness vibration mode is more improved than that of binary solid solutions of $PbZrO_3$-$Pb(Fe_{\frac{1}{3}}Ta_{\frac{2}{3}})O_3$.

When the nominal ratio of $PbZrO_3$ is smaller than the said effective composition ratio, that is, when the nominal ratios of $Pb(Fe_{\frac{1}{3}}Ta_{\frac{2}{3}})O_3$ and $PbTiO_3$ are larger, the dielectric constant is increased, and the electromechanical anistropy of electromechanical coupling factors is decreased.

When the nominal ratio of $PbZrO_3$ is larger than the composition range of the present invention, the resulting ceramic compositions turn anti-ferroelectronics.

Ultimately, the so-called $PbZrO_3$-$PbTiO_3$ ceramic composition having no $Pb(Fe_{\frac{1}{3}}Ta_{\frac{2}{3}})O_3$ have a small electromechanical coupling factor of thickness vibration mode.

EXAMPLE 25

In Table 25, Samples Nos. 1-7 of binary solid solutions of $PbZrO_3$-$Pb(Mn_{\frac{2}{3}}W_{\frac{1}{3}})O_3$ are summarized. The starting materials for use in the present ceramic compositions are powders each of lead oxide (PbO), zirconium oxide ($ZrO_2$), manganese oxide (MnO), and tungsten oxide ($WO_3$), each having a purity of at least 99.9%, unless otherwise specified. Samples are prepared in the same manner as in Example 1.

As is obvious from Samples Nos. 1-4 of Table 25, the piezoelectric substances of this Example have a low dielectric constant such as less than 200, and a large electromechanical anisotropy of electromechanical coupling factors such as more than 10. Some substances have an electromechanical coupling factor of thickness vibration mode kt of more than 0.55, which is characteristically larger than that of the $PbTiO_3$ ceramic compositions.

Samples Nos. 5 and 6 show that the nominal ratio of $Pb(Mn_{\frac{2}{3}}W_{\frac{1}{3}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns anti-ferroelectric.

EXAMPLE 26

The distinguished characteristics of the binary solid solutions of $PbZrO_3$-$Pb(Mn_{\frac{2}{3}}W_{\frac{1}{3}})O_3$ can be retained also in ternary solid solutions of $PbZrO_3$-$Pb(Mn_{\frac{2}{3}}W_{\frac{1}{3}})O_3$-$PbTiO_3$, where $PbTiO_3$ is contained in the binary solid solution, and the mechanical quality factor is increased. Samples are prepared in the same manner as in Example 1. Samples Nos. 8-15 are summarized in Table 26.

As is obvious from each of Samples, each ceramic composition has very large electromechanical coupling factors and mechanical quality factor, and most compositions have a low dielectric constant. The electromechanical coupling factor of thickness vibration mode is more improved than that of the binary solid solutions of $PbZrO_3$-$Pb(Mn_{\frac{2}{3}}W_{\frac{1}{3}})O_3$.

When the nominal ratio of $PbZrO_3$ is smaller than the said effective composition ratio, that is, when the nominal ratios of $Pb(Mn_{\frac{2}{3}}W_{\frac{1}{3}})O_3$ and $PbTiO_3$ are larger, the dielectric constant is increased, and the electromechanical anisotropy of electromechanical coupling factors is decreased.

When the nominal ratio of $PbZrO_3$ is larger than the composition range of the present invention, the resulting ceramic compositions turn anti-ferroelectronics.

Ultimately, the so-called $PbZrO_3$-$PbTiO_3$ ceramic composition having no $Pb(Mn_{\frac{2}{3}}W_{\frac{1}{3}})O_3$ have a small electromechanical coupling factor of thickness vibration mode.

EXAMPLE 27

In Table 27, Samples Nos. 1-7 of binary solid solutions of $PbZrO_3$-$Pb(Sb_{\frac{1}{2}}Nb_{\frac{1}{2}})O_3$ are summarized. The starting materials for use in the present ceramic compositions are powder each of lead oxide (PbO), zirconium oxide ($ZrO_2$), antimony oxide ($Sb_2O_5$) and niobium oxide ($Nb_2O_5$), each having a purity of at least 99.9%, unless otherwise specified. Samples are prepared in the same manner as in Example 1.

As is obvious from Samples Nos. 1-4 of Table 27, the piezoelectric substances of this Example have a low dielectric constant such as less than 200, and a large electromechanical anisotropy of electromechanical coupling factors such as more than 10. Some substances have an electromechanical coupling factor of thickness vibration mode of more than 0.55, which is characteristically larger than that of the $PbTiO_3$ ceramic compositions.

Samples Nos. 5 and 6 show that the nominal ratio of $Pb(Sb_{\frac{1}{2}}Nb_{\frac{1}{2}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceed 0.96, where the resulting ceramic composition turns anti-ferroelectric.

EXAMPLE 28

The distinguished characteristics of the binary solid solution of $PbZrO_3$-$Pb(Sb_{\frac{1}{2}}Nb_{\frac{1}{2}})O_3$ can be retained also in ternary solid solutions of $PbZrO_3$-$Pb(Sb_{\frac{1}{2}}Nb_{\frac{1}{2}})O_3$-$PbTiO_3$, wher $PbTiO_3$ is contained in the binary solid solution. Samples are prepared in the same manner as in Example 1. Samples Nos. 8-15 are summarized in Table 28.

As is obvious from each of Samples, each ceramic composition has very large electromechanical coupling factors, and most compositions have a low dielectric constant. The electromechanical coupling factor of thickness vibration mode is more improved than that of the binary solid solutions of $PbZrO_3$-$Pb(Sb_{\frac{1}{2}}Nb_{\frac{1}{2}})O_3$.

When the nominal ratio of $PbZrO_3$ is smaller than the said effective composition ratio, that is, when the nominal ratios of $Pb(Sb_{\frac{1}{2}}Nb_{\frac{1}{2}})O_3$ and $PbTiO_3$ are larger, the dielectric constant is increased, and the electromechanical anisotropy of electromechanical coupling factors is decreased.

When the nominal ratio of $PbZrO_3$ is larger than the composition range of the present invention, the resulting ceramic compositions turn anti-ferroelectronics.

Ultimately, the so-called $PbZrO_3$-$PbTiO_3$ ceramic compositions containing no $Pb(Sb_{\frac{1}{2}}Nb_{\frac{1}{2}})O_3$ have a small electromechanical coupling factor of thickness vibration mode.

EXAMPLE 29

Samples Nos. 1-7 of binary solid solutions of $PbZrO_3$-$Pb(Fe_{\frac{1}{2}}Ta_{\frac{1}{2}})O_3$ are summarized in Table 29. Starting materials for use in the present ceramic compositions are powders each of lead oxide (PbO), zirconium oxide ($ZrO_2$), iron oxide ($Fe_2O_3$) and tantalum oxide ($Ta_2O_5$), each having purity of at least 99.9%, unless otherwise specified. Samples are prepared in the same manner as in Example 1.

Aa is obvious from Samples Nos. 1-4 of Table 29, the piezoelectric substances of this Example have low dielectric constant such as less than 200, and a large electromechanical anisotropy of electromechanical coupling factors such as more than 10. Some compositions have an electromechanical coupling factor of thickness vibration mode kt of more than 0.55, which is characteristically larger than that of the $PbTiO_3$ ceramic compositions.

Samples Nos. 5 and 6 show that the nomical ratio of $Pb(Fe_{\frac{1}{2}}Ta_{\frac{1}{2}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceed 0.96, where the resulting ceramic compositions turns an anti-ferroelectronic.

EXAMPLE 30

The distinguished characteristics of the binary solid solution of $PbZrO_3$-$Pb(Fe_{\frac{1}{2}}Ta_{\frac{1}{2}})O_3$ can be retained also in ternary solid solutions of $PbZrO_3$-$Pb(Fe_{\frac{1}{2}}Ta_{\frac{1}{2}})O_3$-$PbTiO_3$, where $PbTiO_3$ is contained in the binary solid solution. Samples are prepared in the same manner as in Example 1. Samples Nos. 8-15 are summarized in Table 30.

As is obvious from each of Samples, each ceramic composition has very large electromechanical coupling factors, and most compositions have a low dielectric constant. The electromechanical coupling factor of thickness vibration mode is more improved than that of the binary solid solutions of $PbZrO_3$-$Pb(Fe_{\frac{1}{2}}Ta_{\frac{1}{2}})O_3$.

When the nominal ratio of $PbZrO_3$ is smaller than the said effective composition ratio, that is, when the nominal ratios of $Pb(Fe_{\frac{1}{2}}Ta_{\frac{1}{2}})O_3$ and $PbTiO_3$ are larger, the dielectric constant is increased, and the electromechanical anisotropy of electromechanical coupling factors is decreased.

When the nominal ratio of $PbZrO_3$ is larger than the composition range of the present invention, the resulting ceramic compositions turn anti-ferroelectronics.

Ultimately, the so-called $PbZrO_3$-$PbTiO_3$ ceramic composition containing no $Pb(Fe_{\frac{1}{2}}Ta_{\frac{1}{2}})O_3$ have a small electromechanical coupling factor of thickness vibration mode.

EXAMPLE 31

In Table 31, Samples Nos. 1-7 of binary solid solutions of $PbZrO_3$-$Pb(Fe_{\frac{2}{3}}Te_{\frac{1}{3}})O_3$ are summarized. Starting materials for use in the present ceramic materials are powders each of lead oxide (PbO), zirconium oxide ($ZrO_2$) iron oxide ($Fe_2O_3$) and tellurium oxide ($TeO_2$), each having a purity of at least 99.9%, unless otherwise specified. Samples are prepared in the same manner as in Example 1, but the sintering temperature is 1200°-1300° C.

As is obvious from Samples Nos. 1-4 of Table 31, the piezoelectric substance of this Example have a low dielectric constant such as about 200, and a large electromechanical anisotropy of electromechanical coupling factors such as more than 10. Some substances have an electromechanical coupling factor of thickness vibration mode kt of more than 0.55, which is characteristically larger than that of the $PbTiO_3$ ceramic compositions.

Samples Nos. 5 and 6 show that the nominal ratio of $Pb(Fe_{\frac{2}{3}}Te_{\frac{1}{3}})O_3$ exceeds 0.10, where the dielectric constant is increased, and the electromechanical coupling factor of lateral vibration mode is also increased, resulting in a decrease in the electromechanical anisotropy.

Sample No. 7 shows that the nominal ratio of $PbZrO_3$ exceeds 0.96, where the resulting ceramic composition turns an anti-ferroelectronic.

EXAMPLE 32

The distinguished characteristics of the binary solid solutions of $PbZrO_3$-$Pb(Fe_{\frac{2}{3}}Te_{\frac{1}{3}})O_3$ can be retained also in ternary solid solutions of $PbZrO_3$-$Pb(Fe_{\frac{2}{3}}Te_{\frac{1}{3}})O_3$-$PbTiO_3$ where $PbTiO_3$ is contained in the binary solid solution and the mechanical quality factor is increased. Samples are prepared in the same manner as in Example 1. In Table 3, Samples Nos. 8-15 are summarized.

As is obvious from each of Samples, each ceramic composition has very large electromechanical coupling factors and mechanical quality factor, and most compositions have a small dielectric constant. The electromechanical coupling factor of thickness vibration mode is more improved than that of the binary solid solutions of $PbZrO_3$-$Pb(Fe_{\frac{2}{3}}Te_{\frac{1}{3}})O_3$ when the nominal ratio of $PbZrO_3$ is smaller than the said effective composition ratio, that is, when the nominal ratios of $Pb(Fe_{\frac{2}{3}}Te_{\frac{1}{3}})O_3$ and $PbTiO_3$ are larger, the dielectric constant is increased, and the electromechanical anisotropy of electromechanical coupling factors is decreased.

When the nominal ratio of $PbZrO_3$ is larger than the composition range of the present invention, the resulting ceramic compositions turn anti-ferroelectronics.

Ultimately, the so-called $PbZrO_3$-$PbTiO_3$ ceramic compositions containing no $Pb(Fe_{\frac{2}{3}}Te_{\frac{1}{3}})O_3$ have a small electromechanical coupling factor of thickness vibration mode.

EXAMPLE 33

Figure 2:
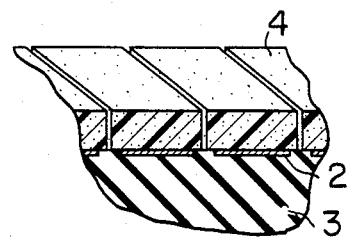

Vibrator element for ultrasonic probe having such a structure as shown in FIG. 2 is fabricated from Sample No. 9 of the foregoing Example 2. The ultrasonic probe using the present piezoelectric substance generally has the same structure as the of the conventional probes shown in FIGS. 1 and 2, and the well known art is applicable to the probes. Thus, description of structure, functioning principle, etc. of the ultrasonic probe is omitted.

Figure 4:
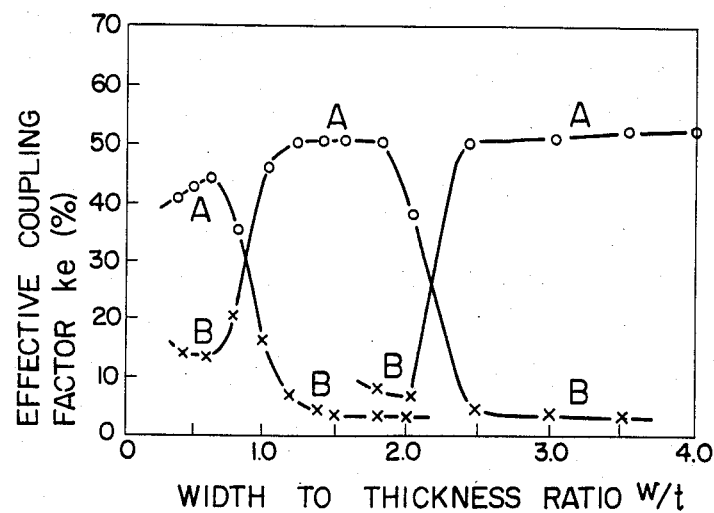
FIG. 4 is a graph showing that the effective electromechanic coupling factor of vibrators of a piezoelectric substance according to one embodiment of the present invention depends upon a ratio of width w to thickness t of the vibrators, i.e. w/t.

In FIG. 4, dependency of electromechanical coupling factor ke upon a ratio of width w to thickness t (w/t) of the vibrator fabricated in these Examples is shown.

Since ke depends upon w/t, it is defined as an effective electromechanic coupling factor of vibrator. In FIG. 4, thickness vibration mode A and spurious vibration (lateral vibration) mode B are brought into coupling in w/t of about 0.9 and about 2.2, that is, both vibration modes are degenerated. However, in the other w/t region than the above two, the coupling factor ke of lateral vibration mode B is very small, and thus it is seen that the influence of lateral vibration mode is very small even when w/t becomes about 4.0. Furthermore, the coupling factor ke of thickness vibration mode A exceeds 50%, and it has been found by tests that the sensitivity to pulse wave form is also equivalent to that of the conventional PZT piezoelectric substances.

Figure 5:
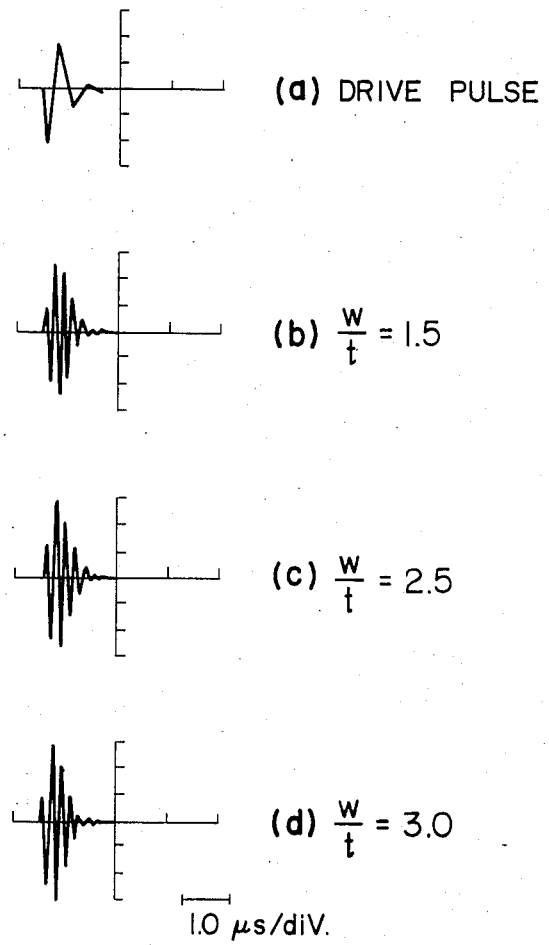
FIG. 5 is graphs showing pulse response wave forms when the ratio w/t is changed in vibrators of a piezoelectric substance according to one embodiment of the present invention.

In FIG. 5, an example of pulse response is shown, where a pulse of about 1 μs can be obtained even when w/t becomes 3.0.

In FIG. 5, (a) is a drive pulse, and (b), (c) and (d) are response wave forms of the said vibrator to the drive pulse.

When all of the piezoelectric substances shown in the foregoing Examples are used as materials for the vibrator, the thus fabricated vibrators have distinguished characteristics as in this Example.

Obviously, many modifications and variations of the present invention are possible in the light of the above teachings. It is therefore to be understood that within the scope of the appended claims the invention may be practiced otherwise than as specifically described.

TABLE 1

| No. | Molar ratio $PbZrO_3$ x | Molar ratio $Pb(Mn_{\frac{1}{3}}Nb_{\frac{2}{3}})O_3$ y | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|
| 1 | 0.96 | 0.04 | 185 | 0.48 | 0.048 | 10 | 440 |
| 2 | 0.95 | 0.05 | 180 | 0.54 | 0.023 | 23.5 | 460 |
| 3 | 0.93 | 0.07 | 185 | 0.56 | 0.030 | 18.7 | 450 |
| 4 | 0.905 | 0.095 | 198 | 0.53 | 0.045 | 11.8 | 480 |
| 5 | 0.90 | 0.10 | 230 | 0.40 | 0.07 | 5.7 | 500 |
| 6 | 0.85 | 0.15 | 241 | 0.35 | 0.13 | 2.7 | 1350 |
| 7 | 0.97 | 0.03 | 190 | — | — | — | — |

TABLE 2

| No. | Molar ratio $PbZrO_3$ x | Molar ratio $Pb(Mn_{\frac{1}{3}}Nb_{\frac{2}{3}})O_3$ y | Molar ratio $PbTiO_3$ z | Dielectric constant $\epsilon_{33}^T$ | Electromechanical coupling factor kt | Electromechanical coupling factor kp | Electromechanical coupling factor ratio kt/kp | Mechanical quality factor $Q_M$ | Curie temp. Tc (°C.) |
|---|---|---|---|---|---|---|---|---|---|
| 8 | 0.945 | 0.025 | 0.03 | 153 | 0.51 | 0.039 | 13.1 | 2000 | |
| 9 | 0.925 | 0.025 | 0.05 | 165 | 0.61 | 0.030 | 20.3 | 3100 | 235 |
| 10 | 0.91 | 0.025 | 0.065 | 171 | 0.53 | 0.041 | 12.9 | 3300 | |
| 11 | 0.925 | 0.05 | 0.025 | 160 | 0.58 | 0.028 | 20.7 | 3500 | 223 |
| 12 | 0.91 | 0.05 | 0.04 | 170 | 0.48 | 0.040 | 12.0 | 3800 | |
| 13 | 0.905 | 0.07 | 0.025 | 173 | 0.50 | 0.038 | 13.1 | 4500 | |
| 14 | 0.932 | 0.005 | 0.063 | 185 | 0.51 | 0.040 | 12.7 | 950 | |
| 15 | 0.905 | 0.005 | 0.090 | 190 | 0.53 | 0.038 | 13.9 | 1100 | |
| 16 | 0.80 | 0.15 | 0.05 | 240 | 0.38 | 0.11 | 3.4 | 5800 | |
| 17 | 0.85 | 0.10 | 0.05 | 230 | 0.43 | 0.09 | 4.8 | 4800 | |
| 18 | 0.80 | 0.10 | 0.10 | 230 | 0.44 | 0.125 | 3.5 | 6300 | |
| 19 | 0.85 | 0.05 | 0.10 | 180 | 0.44 | 0.125 | 3.5 | 5500 | |
| 20 | 0.90 | 0.05 | 0.05 | 175 | 0.43 | 0.095 | 4.5 | 4200 | |
| 21 | 0.90 | 0.025 | 0.075 | 185 | 0.42 | 0.10 | 4.2 | 3500 | |
| 22 | 0.955 | 0.025 | 0.02 | 175 | — | — | — | — | |
| 23 | 0.95 | 0.02 | 0.03 | 188 | — | — | — | — | |
| 24 | 0.94 | 0.01 | 0.05 | 190 | — | — | — | — | |
| 25 | 0.95 | 0.00 | 0.05 | 250 | — | — | — | — | |
| 26 | 0.94 | 0.00 | 0.06 | 261 | — | — | — | — | |
| 27 | 0.92 | 0.00 | 0.08 | 270 | 0.28 | 0.11 | 25. | 430 | |
| 28 | 0.90 | 0.00 | 0.10 | 280 | 0.31 | 0.13 | 2.4 | 580 | 250 |

TABLE 3

| No. | Molar ratio PbZrO$_3$ x | Molar ratio Pb(Mn$_{1/3}$Nb$_{2/3}$)O$_3$ y | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|
| 1 | 0.96  | 0.04  | 188 | 0.50 | 0.05  | 10.0 | 420 |
| 2 | 0.95  | 0.05  | 186 | 0.53 | 0.026 | 20.4 | 430 |
| 3 | 0.93  | 0.07  | 189 | 0.57 | 0.033 | 17.3 | 410 |
| 4 | 0.905 | 0.095 | 199 | 0.54 | 0.048 | 11.2 | 490 |
| 5 | 0.90  | 0.10  | 243 | 0.39 | 0.08  | 4.9  | 550 |
| 6 | 0.85  | 0.15  | 251 | 0.33 | 0.14  | 2.6  | 1430 |
| 7 | 0.97  | 0.03  | 195 | —    | —     | —    | —   |

TABLE 4

| No. | Molar ratio PbZrO$_3$ x | Molar ratio Pb(Mn$_{1/3}$Nb$_{2/3}$)O$_3$ y | Molar ratio PbTiO$_3$ z | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|---|
| 8  | 0.945 | 0.025 | 0.03  | 158 | 0.52 | 0.042 | 12.4 | 1800 |
| 9  | 0.925 | 0.025 | 0.05  | 167 | 0.63 | 0.031 | 20.3 | 2600 |
| 10 | 0.91  | 0.025 | 0.065 | 173 | 0.52 | 0.040 | 13.0 | 2700 |
| 11 | 0.925 | 0.05  | 0.025 | 168 | 0.59 | 0.027 | 21.8 | 2900 |
| 12 | 0.91  | 0.05  | 0.04  | 172 | 0.48 | 0.040 | 12.0 | 2950 |
| 13 | 0.905 | 0.07  | 0.025 | 178 | 0.52 | 0.039 | 13.3 | 3010 |
| 14 | 0.932 | 0.005 | 0.063 | 188 | 0.54 | 0.040 | 13.5 | 880  |
| 15 | 0.905 | 0.005 | 0.090 | 191 | 0.55 | 0.039 | 14.1 | 970  |

TABLE 5

| No. | Molar ratio PbZrO$_3$ x | Molar ratio Pb(Fe$_{1/2}$Sb$_{1/2}$)O$_3$ y | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|
| 1 | 0.96  | 0.04  | 190 | 0.47 | 0.05  | 9.4  | 185 |
| 2 | 0.95  | 0.05  | 191 | 0.50 | 0.035 | 14.2 | 170 |
| 3 | 0.93  | 0.07  | 193 | 0.57 | 0.04  | 14.2 | 183 |
| 4 | 0.905 | 0.095 | 195 | 0.53 | 0.045 | 11.7 | 200 |
| 5 | 0.90  | 0.10  | 253 | 0.38 | 0.11  | 3.4  | 185 |
| 6 | 0.85  | 0.15  | 265 | 0.30 | 0.15  | 2.0  | 180 |
| 7 | 0.97  | 0.03  | 192 | —    | —     | —    | —   |

TABLE 6

| No. | Molar ratio PbZrO$_3$ x | Molar ratio Pb(Fe$_{1/2}$Sb$_{1/2}$)O$_3$ y | Molar ratio PbTiO$_3$ z | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|---|
| 8  | 0.945 | 0.025 | 0.03  | 176 | 0.51 | 0.05  | 10.2 | 185 |
| 9  | 0.925 | 0.025 | 0.05  | 172 | 0.53 | 0.04  | 13.2 | 180 |
| 10 | 0.91  | 0.025 | 0.065 | 185 | 0.50 | 0.045 | 11.1 | 175 |
| 11 | 0.925 | 0.05  | 0.025 | 181 | 0.57 | 0.03  | 19.0 | 180 |
| 12 | 0.91  | 0.05  | 0.04  | 185 | 0.52 | 0.035 | 14.8 | 170 |
| 13 | 0.905 | 0.07  | 0.025 | 183 | 0.51 | 0.04  | 12.7 | 165 |
| 14 | 0.932 | 0.005 | 0.063 | 195 | 0.49 | 0.05  | 9.8  | 150 |
| 15 | 0.905 | 0.005 | 0.090 | 198 | 0.52 | 0.045 | 11.5 | 150 |

TABLE 7

| No. | Molar ratio PbZrO$_3$ x | Molar ratio Pb(Mn$_{1/3}$Ta$_{2/3}$)O$_3$ y | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|
| 1 | 0.96  | 0.04  | 182 | 0.49 | 0.04  | 12.2 | 390 |
| 2 | 0.95  | 0.05  | 178 | 0.53 | 0.03  | 17.6 | 406 |
| 3 | 0.93  | 0.07  | 184 | 0.57 | 0.035 | 16.2 | 421 |
| 4 | 0.905 | 0.095 | 190 | 0.53 | 0.05  | 10.6 | 435 |
| 5 | 0.90  | 0.10  | 231 | 0.41 | 0.09  | 4.5  | 465 |
| 6 | 0.85  | 0.15  | 243 | 0.38 | 0.10  | 3.8  | 905 |

TABLE 7-continued

| | Molar ratio | | Di-electric constant | Electromechanical coupling factor | | Electro-mechanical coupling factor ratio | Mechanical quality factor |
|---|---|---|---|---|---|---|---|
| | PbZrO$_3$ | Pb(Mn$_{\frac{1}{2}}$Ta$_{\frac{1}{2}}$)O$_3$ | | | | | |
| No. | x | y | $\epsilon_{33}{}^T$ | kt | kp | kt/kp | $Q_M$ |
| 7 | 0.97 | 0.03 | 198 | — | — | — | — |

TABLE 8

| | Molar ratio | | | Di-electric constant | Electromechanical coupling factor | | Electro-mechanical coupling factor ratio | Mechanical quality factor |
|---|---|---|---|---|---|---|---|---|
| | PbZrO$_3$ | Pb(Mn$_{\frac{1}{2}}$Ta$_{\frac{1}{2}}$)O$_3$ | PbTiO$_3$ | | | | | |
| No. | x | y | z | $\epsilon_{33}{}^T$ | kt | kp | kt/kp | $Q_M$ |
| 8 | 0.945 | 0.025 | 0.03 | 160 | 0.50 | 0.04 | 12.5 | 1550 |
| 9 | 0.925 | 0.025 | 0.05 | 165 | 0.58 | 0.04 | 14.5 | 2250 |
| 10 | 0.91 | 0.025 | 0.065 | 170 | 0.51 | 0.04 | 12.7 | 2300 |
| 11 | 0.925 | 0.05 | 0.025 | 168 | 0.56 | 0.04 | 14.0 | 2530 |
| 12 | 0.91 | 0.05 | 0.04 | 175 | 0.50 | 0.045 | 11.1 | 2700 |
| 13 | 0.905 | 0.07 | 0.025 | 182 | 0.49 | 0.05 | 9.8 | 2850 |
| 14 | 0.932 | 0.005 | 0.063 | 188 | 0.54 | 0.045 | 12.0 | 780 |
| 15 | 0.905 | 0.005 | 0.090 | 195 | 0.50 | 0.05 | 10.0 | 915 |

TABLE 9

| | Molar ratio | | Di-electric constant | Electromechanical coupling factor | | Electro-mechanical coupling factor ratio | Mechanical quality factor |
|---|---|---|---|---|---|---|---|
| | PbZrO$_3$ | Pb(Mn$_{\frac{1}{3}}$Sb$_{\frac{2}{3}}$)O$_3$ | | | | | |
| No. | x | y | $\epsilon_{33}{}^T$ | kt | kp | kt/kp | $Q_M$ |
| 1 | 0.96 | 0.04 | 198 | 0.46 | 0.05 | 9.2 | 356 |
| 2 | 0.95 | 0.05 | 199 | 0.52 | 0.04 | 13.0 | 380 |
| 3 | 0.93 | 0.07 | 206 | 0.55 | 0.042 | 13.1 | 395 |
| 4 | 0.905 | 0.095 | 218 | 0.49 | 0.05 | 9.8 | 415 |
| 5 | 0.90 | 0.10 | 246 | 0.37 | 0.09 | 4.1 | 425 |
| 6 | 0.85 | 0.15 | 258 | 0.30 | 0.13 | 2.3 | 770 |
| 7 | 0.97 | 0.03 | 203 | — | — | — | — |

TABLE 10

| | Molar ratio | | | Di-electric constant | Electromechanical coupling factor | | Electro-mechanical coupling factor ratio | Mechanical quality factor |
|---|---|---|---|---|---|---|---|---|
| | PbZrO$_3$ | Pb(Mn$_{\frac{1}{3}}$Sb$_{\frac{2}{3}}$)O$_3$ | PbTiO$_3$ | | | | | |
| No. | x | y | z | $\epsilon_{33}{}^T$ | kt | kp | kt/kp | $Q_M$ |
| 8 | 0.945 | 0.025 | 0.03 | 175 | 0.49 | 0.05 | 9.8 | 1550 |
| 9 | 0.925 | 0.025 | 0.05 | 177 | 0.53 | 0.05 | 10.6 | 2130 |
| 10 | 0.91 | 0.025 | 0.065 | 179 | 0.50 | 0.05 | 10.0 | 2320 |
| 11 | 0.925 | 0.05 | 0.025 | 183 | 0.55 | 0.045 | 12.2 | 2500 |
| 12 | 0.91 | 0.05 | 0.04 | 188 | 0.46 | 0.045 | 10.2 | 2730 |
| 13 | 0.905 | 0.07 | 0.025 | 192 | 0.47 | 0.042 | 11.1 | 2810 |
| 14 | 0.932 | 0.005 | 0.063 | 203 | 0.51 | 0.045 | 11.3 | 750 |
| 15 | 0.905 | 0.005 | 0.090 | 216 | 0.50 | 0.05 | 10.0 | 880 |

TABLE 11

| | Molar ratio | | Di-electric constant | Electromechanical coupling factor | | Electro-mechanical coupling factor ratio | Mechanical quality factor |
|---|---|---|---|---|---|---|---|
| | PbZrO$_3$ | Pb(Mn$_{\frac{1}{3}}$Sb$_{\frac{2}{3}}$)O$_3$ | | | | | |
| No. | x | y | $\epsilon_{33}{}^T$ | kt | kp | kt/kp | $Q_M$ |
| 1 | 0.96 | 0.04 | 182 | 0.47 | 0.05 | 9.4 | 345 |
| 2 | 0.95 | 0.05 | 188 | 0.53 | 0.04 | 13.2 | 375 |
| 3 | 0.93 | 0.07 | 192 | 0.57 | 0.04 | 14.2 | 380 |
| 4 | 0.905 | 0.095 | 198 | 0.51 | 0.045 | 11.3 | 405 |
| 5 | 0.90 | 0.10 | 235 | 0.38 | 0.09 | 4.2 | 415 |
| 6 | 0.85 | 0.15 | 248 | 0.32 | 0.14 | 2.2 | 730 |
| 7 | 0.97 | 0.03 | 196 | — | — | — | — |

TABLE 12

| No. | Molar ratio PbZrO$_3$ x | Pb(Mn$_{\frac{1}{2}}$Sb$_{\frac{1}{2}}$)O$_3$ y | PbTiO$_3$ z | Dielectric constant $\epsilon_{33}^T$ | Electromechanical coupling factor kt | kp | Electromechanical coupling factor ratio kt/kp | Mechanical quality factor $Q_M$ |
|---|---|---|---|---|---|---|---|---|
| 8 | 0.945 | 0.025 | 0.03 | 171 | 0.49 | 0.05 | 9.8 | 1480 |
| 9 | 0.925 | 0.025 | 0.05 | 172 | 0.54 | 0.05 | 10.8 | 2080 |
| 10 | 0.91 | 0.025 | 0.065 | 173 | 0.50 | 0.05 | 10.0 | 2150 |
| 11 | 0.925 | 0.05 | 0.025 | 181 | 0.57 | 0.045 | 12.6 | 2320 |
| 12 | 0.91 | 0.05 | 0.04 | 183 | 0.50 | 0.045 | 11.1 | 2560 |
| 13 | 0.905 | 0.07 | 0.025 | 188 | 0.49 | 0.042 | 11.6 | 2600 |
| 14 | 0.932 | 0.005 | 0.063 | 192 | 0.52 | 0.045 | 11.5 | 700 |
| 15 | 0.905 | 0.005 | 0.090 | 202 | 0.50 | 0.05 | 10.0 | 810 |

TABLE 13

| No. | Molar ratio PbZrO$_3$ x | Pb(Fe$_{\frac{1}{2}}$Nb$_{\frac{1}{2}}$)O$_3$ y | Dielectric constant $\epsilon_{33}^T$ | Electromechanical coupling factor kt | kp | Electromechanical coupling factor ratio kt/kp | Mechanical quality factor $Q_M$ |
|---|---|---|---|---|---|---|---|
| 1 | 0.96 | 0.04 | 185 | 0.47 | 0.04 | 11.7 | 215 |
| 2 | 0.95 | 0.05 | 188 | 0.54 | 0.035 | 15.4 | 210 |
| 3 | 0.93 | 0.07 | 185 | 0.56 | 0.03 | 18.6 | 220 |
| 4 | 0.905 | 0.095 | 192 | 0.53 | 0.05 | 10.6 | 205 |
| 5 | 0.90 | 0.10 | 248 | 0.36 | 0.10 | 3.6 | 190 |
| 6 | 0.85 | 0.15 | 255 | 0.30 | 0.15 | 2.0 | 175 |
| 7 | 0.97 | 0.03 | 196 | — | — | — | — |

TABLE 14

| No. | Molar ratio PbZrO$_3$ x | Pb(Fe$_{\frac{1}{2}}$Nb$_{\frac{1}{2}}$)O$_3$ y | PbTiO$_3$ z | Dielectric constant $\epsilon_{33}^T$ | Electromechanical coupling factor kt | kp | Electromechanical coupling factor ratio kt/kp | Mechanical quality factor $Q_M$ |
|---|---|---|---|---|---|---|---|---|
| 8 | 0.945 | 0.025 | 0.03 | 170 | 0.52 | 0.04 | 13.0 | 230 |
| 9 | 0.925 | 0.025 | 0.05 | 173 | 0.59 | 0.03 | 19.6 | 205 |
| 10 | 0.91 | 0.025 | 0.065 | 180 | 0.51 | 0.04 | 12.7 | 203 |
| 11 | 0.925 | 0.05 | 0.025 | 172 | 0.56 | 0.03 | 18.6 | 212 |
| 12 | 0.91 | 0.05 | 0.04 | 171 | 0.50 | 0.035 | 14.2 | 180 |
| 13 | 0.905 | 0.07 | 0.025 | 183 | 0.48 | 0.05 | 9.6 | 175 |
| 14 | 0.932 | 0.005 | 0.063 | 188 | 0.51 | 0.04 | 12.7 | 144 |
| 15 | 0.905 | 0.005 | 0.090 | 197 | 0.50 | 0.04 | 12.5 | 162 |

TABLE 15

| No. | Molar ratio PbZrO$_3$ x | Pb(Fe$_{\frac{1}{2}}$Sb$_{\frac{1}{2}}$)O$_3$ y | Dielectric constant $\epsilon_{33}^T$ | Electromechanical coupling factor kt | kp | Electromechanical coupling factor ratio kt/kp | Mechanical quality factor $Q_M$ |
|---|---|---|---|---|---|---|---|
| 1 | 0.96 | 0.04 | 195 | 0.46 | 0.05 | 9.2 | 195 |
| 2 | 0.95 | 0.05 | 196 | 0.50 | 0.035 | 14.2 | 180 |
| 3 | 0.93 | 0.07 | 200 | 0.55 | 0.04 | 13.7 | 190 |
| 4 | 0.905 | 0.095 | 206 | 0.52 | 0.05 | 10.4 | 205 |
| 5 | 0.90 | 0.10 | 267 | 0.35 | 0.10 | 3.5 | 190 |
| 6 | 0.85 | 0.15 | 280 | 0.30 | 0.16 | 1.8 | 185 |
| 7 | 0.97 | 0.03 | 198 | — | — | — | — |

TABLE 16

| No. | Molar ratio PbZrO$_3$ x | Pb(Fe$_{\frac{1}{2}}$Sb$_{\frac{1}{2}}$)O$_3$ y | PbTiO$_3$ z | Dielectric constant $\epsilon_{33}^T$ | Electromechanical coupling factor kt | kp | Electromechanical coupling factor ratio kt/kp | Mechanical quality factor $Q_M$ |
|---|---|---|---|---|---|---|---|---|
| 8 | 0.945 | 0.025 | 0.03 | 180 | 0.50 | 0.05 | 10.0 | 190 |
| 9 | 0.925 | 0.025 | 0.05 | 182 | 0.54 | 0.04 | 13.5 | 185 |
| 10 | 0.91 | 0.025 | 0.065 | 195 | 0.49 | 0.05 | 9.8 | 170 |
| 11 | 0.925 | 0.05 | 0.025 | 185 | 0.55 | 0.03 | 18.3 | 195 |
| 12 | 0.91 | 0.05 | 0.04 | 192 | 0.49 | 0.03 | 16.3 | 176 |
| 13 | 0.905 | 0.07 | 0.025 | 195 | 0.51 | 0.04 | 12.7 | 170 |

TABLE 16-continued

| | Molar ratio | | | Di-electric constant | Electromechanical coupling factor | | Electro-mechanical coupling factor ratio | Mechanical quality factor |
|---|---|---|---|---|---|---|---|---|
| No. | PbZrO$_3$ x | Pb(Fe$_{\frac{1}{2}}$Sb$_{\frac{1}{2}}$)O$_3$ y | PbTiO$_3$ z | $\epsilon_{33}{}^T$ | kt | kp | kt/kp | Q$_M$ |
| 14 | 0.932 | 0.005 | 0.063 | 206 | 0.48 | 0.05 | 9.6 | 140 |
| 15 | 0.905 | 0.005 | 0.090 | 208 | 0.53 | 0.05 | 10.6 | 155 |

TABLE 17

| | Molar ratio | | Di-electric constant | Electromechanical coupling factor | | Electro-mechanical coupling factor ratio | Mechanical quality factor |
|---|---|---|---|---|---|---|---|
| No. | PbZrO$_3$ x | Pb(Mn$_{\frac{1}{3}}$Ta$_{\frac{2}{3}}$)O$_3$ y | $\epsilon_{33}{}^T$ | kt | kp | kt/kp | Q$_M$ |
| 1 | 0.96 | 0.04 | 192 | 0.47 | 0.045 | 10.4 | 380 |
| 2 | 0.95 | 0.05 | 190 | 0.52 | 0.03 | 17.3 | 395 |
| 3 | 0.93 | 0.07 | 196 | 0.55 | 0.035 | 15.7 | 413 |
| 4 | 0.905 | 0.095 | 200 | 0.50 | 0.045 | 11.1 | 430 |
| 5 | 0.90 | 0.10 | 235 | 0.38 | 0.08 | 4.7 | 445 |
| 6 | 0.85 | 0.15 | 248 | 0.34 | 0.11 | 3.1 | 860 |
| 7 | 0.97 | 0.03 | 192 | — | — | — | — |

TABLE 18

| | Molar ratio | | | Di-electric constant | Electromechanical coupling factor | | Electro-mechanical coupling factor ratio | Mechanical quality factor |
|---|---|---|---|---|---|---|---|---|
| No. | PbZrO$_3$ x | Pb(Mn$_{\frac{1}{3}}$Ta$_{\frac{2}{3}}$)O$_3$ y | PbTiO$_3$ z | $\epsilon_{33}{}^T$ | kt | kp | kt/kp | Q$_M$ |
| 8 | 0.945 | 0.025 | 0.03 | 163 | 0.50 | 0.045 | 11.1 | 1650 |
| 9 | 0.925 | 0.025 | 0.05 | 168 | 0.58 | 0.040 | 14.5 | 2300 |
| 10 | 0.91 | 0.025 | 0.065 | 172 | 0.50 | 0.040 | 12.5 | 2400 |
| 11 | 0.925 | 0.05 | 0.025 | 175 | 0.55 | 0.038 | 14.5 | 2600 |
| 12 | 0.91 | 0.05 | 0.04 | 181 | 0.47 | 0.045 | 10.4 | 2850 |
| 13 | 0.905 | 0.07 | 0.025 | 188 | 0.49 | 0.040 | 12.2 | 2920 |
| 14 | 0.932 | 0.005 | 0.063 | 192 | 0.53 | 0.040 | 13.2 | 800 |
| 15 | 0.905 | 0.005 | 0.090 | 204 | 0.51 | 0.045 | 11.3 | 925 |

TABLE 19

| | Molar ratio | | Di-electric constant | Electromechanical coupling factor | | Electro-mechanical coupling factor ratio | Mechanical quality factor |
|---|---|---|---|---|---|---|---|
| No. | PbZrO$_3$ x | Pb(Fe$_{\frac{1}{2}}$Nb$_{\frac{1}{2}}$)O$_3$ y | $\epsilon_{33}{}^T$ | kt | kp | kt/kp | Q$_M$ |
| 1 | 0.96 | 0.04 | 192 | 0.47 | 0.045 | 10.4 | 230 |
| 2 | 0.95 | 0.05 | 194 | 0.53 | 0.03 | 17.6 | 215 |
| 3 | 0.93 | 0.07 | 198 | 0.55 | 0.03 | 18.3 | 235 |
| 4 | 0.905 | 0.095 | 202 | 0.52 | 0.05 | 10.4 | 210 |
| 5 | 0.90 | 0.10 | 254 | 0.37 | 0.09 | 4.1 | 195 |
| 6 | 0.85 | 0.15 | 265 | 0.31 | 0.14 | 2.2 | 180 |
| 7 | 0.97 | 0.03 | 198 | — | — | — | — |

TABLE 20

| | Molar ratio | | | Di-electric constant | Electromechanical coupling factor | | Electro-mechanical coupling factor ratio | Mechanical quality factor |
|---|---|---|---|---|---|---|---|---|
| No. | PbZrO$_3$ x | Pb(Fe$_{\frac{1}{2}}$Nb$_{\frac{1}{2}}$)O$_3$ y | PbTiO$_3$ z | $\epsilon_{33}{}^T$ | kt | kp | kt/kp | Q$_M$ |
| 8 | 0.945 | 0.025 | 0.03 | 171 | 0.51 | 0.045 | 11.3 | 245 |
| 9 | 0.925 | 0.025 | 0.05 | 177 | 0.58 | 0.035 | 16.6 | 210 |
| 10 | 0.91 | 0.025 | 0.065 | 184 | 0.50 | 0.04 | 12.5 | 215 |
| 11 | 0.925 | 0.05 | 0.025 | 177 | 0.55 | 0.03 | 18.3 | 220 |
| 12 | 0.91 | 0.05 | 0.04 | 180 | 0.49 | 0.04 | 12.2 | 185 |
| 13 | 0.905 | 0.07 | 0.025 | 183 | 0.50 | 0.04 | 12.5 | 180 |
| 14 | 0.932 | 0.005 | 0.063 | 192 | 0.52 | 0.04 | 13.0 | 150 |
| 15 | 0.905 | 0.005 | 0.090 | 198 | 0.52 | 0.04 | 13.0 | 165 |

TABLE 21

| No. | Molar ratio PbZrO$_3$ x | Molar ratio Pb(Sb$_{\frac{1}{2}}$Ta$_{\frac{1}{2}}$)O$_3$ y | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|
| 1 | 0.96 | 0.04 | 186 | 0.48 | 0.04 | 12.0 | 215 |
| 2 | 0.95 | 0.05 | 192 | 0.52 | 0.04 | 13.0 | 238 |
| 3 | 0.93 | 0.07 | 198 | 0.56 | 0.03 | 18.6 | 240 |
| 4 | 0.905 | 0.095 | 200 | 0.50 | 0.04 | 12.5 | 216 |
| 5 | 0.90 | 0.10 | 238 | 0.36 | 0.12 | 3.0 | 225 |
| 6 | 0.85 | 0.15 | 256 | 0.30 | 0.16 | 1.8 | 240 |
| 7 | 0.97 | 0.03 | 198 | — | — | — | — |

TABLE 22

| No. | Molar ratio PbZrO$_3$ x | Molar ratio Pb(Sb$_{\frac{1}{2}}$Ta$_{\frac{1}{2}}$)O$_3$ y | Molar ratio PbTiO$_3$ z | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|---|
| 8 | 0.945 | 0.025 | 0.03 | 175 | 0.50 | 0.04 | 12.5 | 235 |
| 9 | 0.925 | 0.025 | 0.05 | 188 | 0.54 | 0.03 | 18.0 | 270 |
| 10 | 0.91 | 0.025 | 0.065 | 197 | 0.52 | 0.04 | 13.0 | 305 |
| 11 | 0.925 | 0.05 | 0.025 | 185 | 0.59 | 0.04 | 14.7 | 200 |
| 12 | 0.91 | 0.05 | 0.04 | 197 | 0.60 | 0.035 | 17.1 | 198 |
| 13 | 0.905 | 0.07 | 0.025 | 199 | 0.52 | 0.04 | 13.0 | 225 |
| 14 | 0.932 | 0.005 | 0.063 | 200 | 0.48 | 0.05 | 9.6 | 240 |
| 15 | 0.905 | 0.005 | 0.090 | 197 | 0.49 | 0.05 | 9.8 | 235 |

TABLE 23

| No. | Molar ratio PbZrO$_3$ x | Molar ratio Pb(Fe$_{\frac{1}{3}}$Ta$_{\frac{2}{3}}$)O$_3$ y | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|
| 1 | 0.96 | 0.04 | 193 | 0.46 | 0.045 | 10.2 | 210 |
| 2 | 0.95 | 0.05 | 194 | 0.52 | 0.03 | 17.3 | 195 |
| 3 | 0.93 | 0.07 | 199 | 0.55 | 0.03 | 18.3 | 198 |
| 4 | 0.905 | 0.095 | 204 | 0.51 | 0.045 | 11.3 | 206 |
| 5 | 0.90 | 0.10 | 263 | 0.38 | 0.08 | 4.7 | 198 |
| 6 | 0.85 | 0.15 | 271 | 0.30 | 0.14 | 2.1 | 188 |
| 7 | 0.97 | 0.03 | 197 | — | — | — | — |

TABLE 24

| No. | Molar ratio PbZrO$_3$ x | Molar ratio Pb(Fe$_{\frac{1}{3}}$Ta$_{\frac{2}{3}}$)O$_3$ y | Molar ratio PbTiO$_3$ z | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|---|
| 8 | 0.945 | 0.025 | 0.03 | 176 | 0.51 | 0.045 | 11.3 | 230 |
| 9 | 0.925 | 0.025 | 0.05 | 179 | 0.55 | 0.035 | 15.7 | 205 |
| 10 | 0.91 | 0.025 | 0.065 | 188 | 0.50 | 0.05 | 10.0 | 220 |
| 11 | 0.925 | 0.05 | 0.025 | 180 | 0.55 | 0.03 | 18.3 | 215 |
| 12 | 0.91 | 0.05 | 0.04 | 185 | 0.48 | 0.03 | 16.0 | 180 |
| 13 | 0.905 | 0.07 | 0.025 | 187 | 0.50 | 0.04 | 12.5 | 175 |
| 14 | 0.932 | 0.005 | 0.063 | 203 | 0.49 | 0.045 | 10.8 | 150 |
| 15 | 0.905 | 0.005 | 0.090 | 205 | 0.52 | 0.05 | 10.4 | 160 |

TABLE 25

| No. | Molar ratio PbZrO$_3$ x | Molar ratio Pb(Mn$_{\frac{1}{2}}$W$_{\frac{1}{2}}$)O$_3$ y | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|
| 1 | 0.96 | 0.04 | 178 | 0.52 | 0.04 | 13.0 | 830 |
| 2 | 0.95 | 0.05 | 176 | 0.54 | 0.03 | 18.0 | 835 |
| 3 | 0.93 | 0.07 | 173 | 0.61 | 0.03 | 20.3 | 860 |
| 4 | 0.905 | 0.095 | 185 | 0.58 | 0.04 | 14.5 | 935 |
| 5 | 0.90 | 0.10 | 232 | 0.37 | 0.08 | 4.6 | 960 |
| 6 | 0.85 | 0.15 | 246 | 0.33 | 0.13 | 2.5 | 1530 |

TABLE 25-continued

| | Molar ratio | | Di-electric constant | Electromechanical coupling factor | | Electro-mechanical coupling factor ratio | Mechanical quality factor |
| | PbZrO$_3$ | Pb(Mn$_{\frac{2}{3}}$W$_{\frac{1}{3}}$)O$_3$ | | | | | |
| No. | x | y | $\epsilon_{33}{}^T$ | kt | kp | kt/kp | $Q_M$ |
|---|---|---|---|---|---|---|---|
| 7 | 0.97 | 0.03 | 190 | — | — | — | — |

TABLE 26

| | Molar ratio | | | Di-electric constant | Electromechanical coupling factor | | Electro-mechanical coupling factor ratio | Mechanical quality factor |
| | PbZrO$_3$ | Pb(Mn$_{\frac{2}{3}}$W$_{\frac{1}{3}}$)O$_3$ | PbTiO$_3$ | | | | | |
| No. | x | y | z | $\epsilon_{33}{}^T$ | kt | kp | kt/kp | $Q_M$ |
|---|---|---|---|---|---|---|---|---|
| 8 | 0.945 | 0.025 | 0.03 | 155 | 0.53 | 0.04 | 13.2 | 1950 |
| 9 | 0.925 | 0.025 | 0.05 | 163 | 0.64 | 0.03 | 21.3 | 2850 |
| 10 | 0.91 | 0.025 | 0.065 | 168 | 0.53 | 0.035 | 15.1 | 2880 |
| 11 | 0.925 | 0.05 | 0.025 | 165 | 0.60 | 0.03 | 20.0 | 3050 |
| 12 | 0.91 | 0.05 | 0.04 | 168 | 0.51 | 0.04 | 12.7 | 3230 |
| 13 | 0.905 | 0.07 | 0.025 | 170 | 0.53 | 0.035 | 15.1 | 3350 |
| 14 | 0.932 | 0.005 | 0.063 | 178 | 0.55 | 0.04 | 13.7 | 1560 |
| 15 | 0.905 | 0.005 | 0.090 | 188 | 0.55 | 0.04 | 13.7 | 1630 |

TABLE 27

| | Molar ratio | | Di-electric constant | Electromechanical coupling factor | | Electro-mechanical coupling factor ratio | Mechanical quality factor |
| | PbZrO$_3$ | Pb(Sb$_{\frac{1}{2}}$Nb$_{\frac{1}{2}}$)O$_3$ | | | | | |
| No. | x | y | $\epsilon_{33}{}^T$ | kt | kp | kt/kp | $Q_M$ |
|---|---|---|---|---|---|---|---|
| 1 | 0.96 | 0.04 | 185 | 0.49 | 0.045 | 10.8 | 250 |
| 2 | 0.95 | 0.05 | 188 | 0.53 | 0.03 | 17.6 | 283 |
| 3 | 0.93 | 0.07 | 192 | 0.58 | 0.03 | 19.3 | 275 |
| 4 | 0.905 | 0.095 | 198 | 0.53 | 0.04 | 13.2 | 250 |
| 5 | 0.90 | 0.10 | 233 | 0.37 | 0.10 | 3.7 | 235 |
| 6 | 0.85 | 0.15 | 245 | 0.30 | 0.15 | 2.0 | 280 |
| 7 | 0.97 | 0.03 | 192 | — | — | — | — |

TABLE 28

| | Molar ratio | | | Di-electric constant | Electromechanical coupling factor | | Electro-mechanical coupling factor ratio | Mechanical quality factor |
| | PbZrO$_3$ | Pb(Sb$_{\frac{1}{2}}$Nb$_{\frac{1}{2}}$)O$_3$ | PbTiO$_3$ | | | | | |
| No. | x | y | z | $\epsilon_{33}{}^T$ | kt | kp | kt/kp | $Q_M$ |
|---|---|---|---|---|---|---|---|---|
| 8 | 0.945 | 0.025 | 0.03 | 173 | 0.51 | 0.04 | 12.7 | 275 |
| 9 | 0.925 | 0.025 | 0.05 | 183 | 0.55 | 0.03 | 18.3 | 300 |
| 10 | 0.91 | 0.025 | 0.065 | 192 | 0.51 | 0.04 | 12.7 | 350 |
| 11 | 0.925 | 0.05 | 0.025 | 180 | 0.60 | 0.035 | 17.1 | 230 |
| 12 | 0.91 | 0.05 | 0.04 | 188 | 0.61 | 0.04 | 15.2 | 215 |
| 13 | 0.905 | 0.07 | 0.025 | 187 | 0.49 | 0.04 | 12.2 | 230 |
| 14 | 0.932 | 0.005 | 0.063 | 190 | 0.51 | 0.05 | 10.2 | 285 |
| 15 | 0.905 | 0.005 | 0.090 | 198 | 0.52 | 0.05 | 10.4 | 280 |

TABLE 29

| | Molar ratio | | Di-electric constant | Electromechanical coupling factor | | Electro-mechanical coupling factor ratio | Mechanical quality factor |
| | PbZrO$_3$ | Pb(Fe$_{\frac{1}{2}}$Ta$_{\frac{1}{2}}$)O$_3$ | | | | | |
| No. | x | y | $\epsilon_{33}{}^T$ | kt | kp | kt/kp | $Q_M$ |
|---|---|---|---|---|---|---|---|
| 1 | 0.96 | 0.04 | 188 | 0.47 | 0.04 | 11.7 | 198 |
| 2 | 0.95 | 0.05 | 187 | 0.53 | 0.03 | 17.6 | 180 |
| 3 | 0.93 | 0.07 | 191 | 0.60 | 0.03 | 20.0 | 183 |
| 4 | 0.905 | 0.095 | 193 | 0.50 | 0.05 | 10.0 | 190 |
| 5 | 0.90 | 0.10 | 250 | 0.36 | 0.09 | 4.0 | 182 |
| 6 | 0.85 | 0.15 | 263 | 0.33 | 0.15 | 2.2 | 185 |
| 7 | 0.97 | 0.03 | 198 | — | — | — | — |

TABLE 30

| No. | Molar ratio PbZrO$_3$ x | Molar ratio Pb(Fe$_{\frac{1}{2}}$Ta$_{\frac{1}{2}}$)O$_3$ y | Molar ratio PbTiO$_3$ z | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|---|
| 8 | 0.945 | 0.025 | 0.03 | 175 | 0.51 | 0.04 | 12.7 | 215 |
| 9 | 0.925 | 0.025 | 0.05 | 173 | 0.56 | 0.04 | 14.0 | 198 |
| 10 | 0.91 | 0.025 | 0.065 | 180 | 0.50 | 0.05 | 10.0 | 190 |
| 11 | 0.925 | 0.05 | 0.025 | 179 | 0.63 | 0.03 | 21.0 | 210 |
| 12 | 0.91 | 0.05 | 0.04 | 181 | 0.46 | 0.03 | 15.3 | 170 |
| 13 | 0.905 | 0.07 | 0.025 | 180 | 0.49 | 0.04 | 12.2 | 163 |
| 14 | 0.932 | 0.005 | 0.063 | 192 | 0.50 | 0.04 | 12.5 | 145 |
| 15 | 0.905 | 0.005 | 0.090 | 198 | 0.51 | 0.05 | 10.2 | 156 |

TABLE 31

| No. | Molar ratio PbZrO$_3$ x | Molar ratio Pb(Fe$_{\frac{2}{3}}$Te$_{\frac{1}{3}}$)O$_3$ y | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|
| 1 | 0.96 | 0.04 | 185 | 0.48 | 0.05 | 9.6 | 560 |
| 2 | 0.95 | 0.05 | 192 | 0.54 | 0.04 | 13.5 | 580 |
| 3 | 0.93 | 0.07 | 198 | 0.56 | 0.05 | 11.2 | 635 |
| 4 | 0.905 | 0.095 | 200 | 0.53 | 0.05 | 10.6 | 660 |
| 5 | 0.90 | 0.10 | 242 | 0.38 | 0.10 | 3.8 | 675 |
| 6 | 0.85 | 0.15 | 253 | 0.30 | 0.15 | 2.0 | 680 |
| 7 | 0.97 | 0.03 | 195 | — | — | — | — |

TABLE 32

| No. | Molar ratio PbZrO$_3$ x | Molar ratio Pb(Fe$_{\frac{2}{3}}$Te$_{\frac{1}{3}}$)O$_3$ y | Molar ratio PbTiO$_3$ z | Dielectric constant $\epsilon_{33}^T$ | Electromechanical coupling factor kt | Electromechanical coupling factor kp | Electromechanical coupling factor ratio kt/kp | Mechanical quality factor $Q_M$ |
|---|---|---|---|---|---|---|---|---|
| 8 | 0.945 | 0.025 | 0.03 | 175 | 0.51 | 0.04 | 12.7 | 570 |
| 9 | 0.925 | 0.025 | 0.05 | 182 | 0.58 | 0.04 | 14.5 | 585 |
| 10 | 0.91 | 0.025 | 0.065 | 188 | 0.50 | 0.04 | 12.5 | 580 |
| 11 | 0.925 | 0.05 | 0.025 | 175 | 0.55 | 0.03 | 18.3 | 625 |
| 12 | 0.91 | 0.05 | 0.04 | 185 | 0.49 | 0.04 | 12.2 | 630 |
| 13 | 0.905 | 0.07 | 0.025 | 192 | 0.50 | 0.05 | 10.0 | 683 |
| 14 | 0.932 | 0.005 | 0.063 | 198 | 0.53 | 0.05 | 10.6 | 570 |
| 15 | 0.905 | 0.005 | 0.090 | 195 | 0.55 | 0.04 | 13.7 | 585 |

What is claimed is:

1. A piezoelectric substance, which consists essentially of a binary solid solution having a composition represented by the general formula:

$$xPbZrO_3 - yA$$

wherein $0.905 \leq x \leq 0.960$ and $x + y = 1.00$ and A is a substance selected from the group consisting of Pb(Mn$_{\frac{1}{3}}$Nb$_{\frac{2}{3}}$)O$_3$, Pb(Mn$_{\frac{1}{2}}$Nb$_{\frac{1}{2}}$)O$_3$, Pb(Fe$_{\frac{1}{2}}$Sb$_{\frac{1}{2}}$)O$_3$, Pb(Mn$_{\frac{1}{2}}$Ta$_{\frac{1}{2}}$)O$_3$, Pb(Mn$_{\frac{1}{3}}$Sb$_{\frac{2}{3}}$)O$_3$, Pb(Mn$_{\frac{1}{2}}$Sb$_{\frac{1}{2}}$)O$_3$, Pb(Fe$_{\frac{1}{2}}$Nb$_{\frac{1}{2}}$)O$_3$, Pb(Fe$_{\frac{1}{3}}$Sb$_{\frac{2}{3}}$)O$_3$, Pb(Mn$_{\frac{1}{3}}$Ta$_{\frac{2}{3}}$)O$_3$, Pb(Fe$_{\frac{2}{3}}$Nb$_{\frac{1}{3}}$)O$_3$, Pb(Sb$_{\frac{1}{2}}$Ta$_{\frac{1}{2}}$)O$_3$, Pb(Fe$_{\frac{1}{3}}$Ta$_{\frac{2}{3}}$)O$_3$, Pb(Mn$_{\frac{2}{3}}$W$_{\frac{1}{3}}$)O$_3$, Pb(Sb$_{\frac{1}{2}}$Nb$_{\frac{1}{2}}$)O$_3$, Pb(Fe$_{\frac{2}{3}}$Ta$_{\frac{1}{3}}$)O$_3$, and Pb(Fe$_{\frac{2}{3}}$Te$_{\frac{1}{3}}$)O$_3$, the binary solid solution having an electromechanical coupling factor of thickness vibration mode kt of at least 0.46 and an electromechanical coupling factor ratio kt/kp of at least 9.2.

2. A piezoelectric substance, which consists essentially of a ternary solid solution having a composition represented by the general formula:

$$xPbZrO_3 - yA - zPbTiO_3$$

and having a composition ratio represented by coordinate in a quadrilateral formed by successively connecting point P (x=0.905; y=0.095; z=0.000), point Q (x=0.960; y=0.040; z=0.000), point R (x=0.932; y=0.005; z=0.063), point S (x=0.905; y=0.005; z=0.090) and said P by straight lines, including the respective lines except the straight line connecting point P to point Q, in a ternary composition diagram showing the composition of said ternary solid solution, and said A being a substance selected from the group consisting of Pb(Mn$_{\frac{1}{3}}$Nb$_{\frac{2}{3}}$)O$_3$, Pb(Mn$_{\frac{1}{2}}$Nb$_{\frac{1}{2}}$)O$_3$, Pb(Fe$_{\frac{1}{2}}$Sb$_{\frac{1}{2}}$)O$_3$, Pb(Mn$_{\frac{1}{2}}$Ta$_{\frac{1}{2}}$)O$_3$, Pb(Mn$_{\frac{1}{3}}$Sb$_{\frac{2}{3}}$)O$_3$, Pb(Mn$_{\frac{1}{2}}$Sb$_{\frac{1}{2}}$)O$_3$, Pb(Fe$_{\frac{1}{2}}$Nb$_{\frac{1}{2}}$)O$_3$, Pb(Fe$_{\frac{1}{3}}$Sb$_{\frac{2}{3}}$)O$_3$, Pb(Mn$_{\frac{1}{3}}$Ta$_{\frac{2}{3}}$)O$_3$, Pb(Fe$_{\frac{2}{3}}$Nb$_{\frac{1}{3}}$)O$_3$, Pb(Sb$_{\frac{1}{2}}$Ta$_{\frac{1}{2}}$)O$_3$, Pb(Fe$_{\frac{1}{3}}$Ta$_{\frac{2}{3}}$)O$_3$, Pb(Mn$_{\frac{2}{3}}$W$_{\frac{1}{3}}$)O$_3$, Pb(Sb$_{\frac{1}{2}}$Nb$_{\frac{1}{2}}$)O$_3$, Pb(Fe$_{\frac{2}{3}}$Ta$_{\frac{1}{3}}$)O$_3$, and Pb(Fe$_{\frac{2}{3}}$Te$_{\frac{1}{3}}$)O$_3$, the ternary solid solution having an electromechanical coupling factor of thickness vibration mode kt of at least 0.46 and an electromechanical coupling factor ratio kt/kp of at least 9.6.

* * * * *